(12) United States Patent
Park et al.

(10) Patent No.: US 8,916,447 B2
(45) Date of Patent: Dec. 23, 2014

(54) METHOD OF FABRICATING SEMICONDUCTOR DEVICE

(75) Inventors: Jong-chul Park, Hwaseong-si (KR); Sang-sup Jeong, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 541 days.

(21) Appl. No.: 13/293,777

(22) Filed: Nov. 10, 2011

(65) Prior Publication Data
US 2012/0135579 A1    May 31, 2012

(30) Foreign Application Priority Data
Nov. 25, 2010   (KR) .......................... 10-2010-0118103

(51) Int. Cl.
| | |
|---|---|
| *H01L 21/02* | (2006.01) |
| *H01L 21/60* | (2006.01) |
| *H01L 21/762* | (2006.01) |
| *H01L 27/108* | (2006.01) |
| *H01L 27/02* | (2006.01) |

(52) U.S. Cl.
CPC ...... *H01L 27/0207* (2013.01); *H01L 27/10855* (2013.01); *H01L 27/10888* (2013.01)
USPC ............................ 438/381; 438/424; 438/612

(58) Field of Classification Search
CPC ..................... H01L 27/0207; H01L 27/10888; H01L 27/10855
USPC .................. 438/381, 424, 612; 257/E21.008, 257/E21.546, E21.506
See application file for complete search history.

(56) References Cited

U.S. PATENT DOCUMENTS

| | | | |
|---|---|---|---|
| 2003/0054600 A1 | 3/2003 | Uchiyama | |
| 2008/0179705 A1* | 7/2008 | Noelscher et al. | ............ 257/506 |

FOREIGN PATENT DOCUMENTS

| | | |
|---|---|---|
| JP | 2008-042075 A | 2/2008 |
| KR | 10-0555564 B1 | 2/2006 |

* cited by examiner

*Primary Examiner* — Walter H Swanson
(74) *Attorney, Agent, or Firm* — Harness, Dickey & Pierce, P.L.C.

(57) ABSTRACT

A method uses a line pattern to form a semiconductor device including asymmetrical contact arrays. The method includes forming a plurality of parallel first conductive line layers extending in a first direction on a semiconductor substrate. In this method, the semiconductor substrate may have active regions forming an oblique angle with the first direction. The method may further include forming a first mask layer and a second mask layer and using the first mask layer and the second mask layer to form a trench comprising a line area and a contact area by etching the first conductive line layers using the first mask layer and the second mask layer. The method further includes forming a gap filling layer filling the line area of the trench and forming a spacer of sidewalls of the contact area and forming a second conductive line layer electrically connected to the active region.

20 Claims, 32 Drawing Sheets

METHOD OF FABRICATING SEMICONDUCTOR DEVICE

CROSS-REFERENCE TO RELATED APPLICATIONS

This application claims priority under 35 U.S.C. 119 to Korean Patent Application No. 10-2010-0118103, filed on Nov. 25, 2010, in the Korean Intellectual Property Office (KIPO), the entire contents of which is incorporated herein by reference.

BACKGROUND

1. Field

Example embodiments of the inventive concepts relate to a method of fabricating a semiconductor device, and more particularly, to a method of fabricating a semiconductor device including asymmetrical contact arrays.

2. Description of the Related Art

With the increased integration degree of semiconductor devices, a pitch in patterns formed in semiconductors is also rapidly reduced. In particular, as the size of transistors is reduced, a channel length is also reduced, thereby generating a short channel effect.

Accordingly, to reduce a transistor size and increase a channel length, a transistor having a recess channel structure, for example, a transistor having a buried gate electrode by forming a gate electrode in a semiconductor substrate, has been introduced. Furthermore, contacts suitable for the buried gate electrode structure have been introduced.

SUMMARY

Example embodiments of the inventive concepts provide a method of fabricating a semiconductor device including asymmetrical contact arrays formed by using a line pattern, and more particularly, a method of fabricating a semiconductor device including contact arrays having a zigzag structure by using a double patterning technology (DPT) using a line pattern.

In accordance with example embodiments, a method of fabricating a semiconductor device may include forming a plurality of first conductive line layers on a semiconductor substrate. In example embodiments, the plurality of first conductive line layers may extend in a first direction and may be spaced apart from each other in a second direction perpendicular to the first direction. In example embodiments, the semiconductor substrate may have an active region extending in a third direction and the third direction may be oblique with respect to the first direction. In example embodiments, the method may further include forming a first mask layer on the plurality of first conductive line layers and forming a second mask layer on the first mask layer. In example embodiments the first mask layer may have line patterns extending in the second direction and the second mask layer may have an open area for a first contact. In example embodiments, the method may further include forming a trench comprising a line area corresponding to the line patterns and a contact area corresponding to the open area in the second mask layer by etching the plurality of first conductive line layers using the first mask layer and the second mask layer. The method may further include forming a gap filling layer filling the line area of the trench and forming spacers on sidewalls of the contact area of the trench, and forming a second conductive line layer on the gap filling layer. In example embodiments, the second conductive line layer may extend in the second direction and may be electrically connected to the active region.

In accordance with example embodiments a method of fabricating a semiconductor device comprising a contact may include forming a first conductive line layer on a semiconductor substrate. In example embodiments, the first conductive line layer may comprise a plurality of first conductive lines each having a linear shape that extends in a first direction, each of the first conductive lines may be spaced apart from each other in a second direction perpendicular to the first direction, and the semiconductor substrate may have an active region extending at an oblique angle with respect to the first direction. The method may further include forming a first mask layer on the first conductive line layer. In example embodiments, the first mask layer may comprise a lower first mask layer and an upper first mask layer and the upper first mask layer may have an open area for forming a first contact. The method may further include forming a second mask layer on the first mask layer. In example embodiments, the second mask layer may comprise a lower second mask layer and an upper second mask layer and the upper second mask layer may have a line pattern extending in the second direction. The method may further include etching the first conductive line layer using the first mask layer and the second mask layer to form a trench comprising a line area corresponding to the line pattern and a contact area corresponding to the open area. The method may further include forming a gap filling layer filling the line area of the trench and forming spacers on sidewalls of the contact area of the trench. The method may further include forming a first contact by filling a space between the spacers on the sidewalls of the contact area with a conductive material. The method may further include forming a second conductive line layer on the gap filling layer, the second conductive line layer being formed in a linear shape in the second direction and electrically connected to the active region via the first contact.

In example embodiments, a method of fabricating a semiconductor device may include providing a substrate having an elongated active region thereon, wherein the elongated active region extends in a first direction. In example embodiments, the method may further include forming a plurality of first conductive line layers on the substrate, wherein the plurality of first conductive line layers extend in a second direction and are spaced apart from each other in a third direction which is perpendicular to the second direction. The method may further include forming a direct contact at a middle of the elongated active region, forming first and second landing pads at first and second ends of the elongated active region, forming a bit line on the direct contact, and forming first and second buried contacts on the first and second landing pads. In example embodiments the first and second buried contacts may be formed eccentrically on the first and second landing pads, and the first direction and the second direction may form an oblique angle.

According to an aspect of the inventive concepts, there is provided a method of fabricating a semiconductor device, the method may include the operations of forming a plurality of first conductive line layers having a linear shape in a first direction to be spaced apart from each other along a second direction perpendicular to a first direction, on a semiconductor substrate in which active regions having an oblique angle with the first direction are defined. The method may further include forming a first mask layer having a line pattern in the second direction on the first conductive line layer, forming a second mask layer comprising an open area for a first contact on the first mask layer, forming a trench comprising a line area corresponding to the line pattern and a contact area corresponding to the open area by etching the first conductive line layer using the first mask layer and the second mask layer, forming a gap filling layer filling the line area of the trench and forming a spacer of sidewalls of the contact area of the trench, and forming a second conductive line layer formed in a linear shape in the second direction and electrically connected to the active region, on the gap filling layer.

The first conductive line layer may be partitioned by the gap filling layer to form a plurality of landing pads, and the landing pads may be aligned in a zigzag line with respect to the second direction. Also, landing pads may be alternately disposed in a line in the first direction at a first interval and a second interval which are different from each other, and the active region may cross a portion of the second interval, and both ends of the active region are electrically connected to the landing pads.

The method may further include the operation of forming a first contact that is electrically connected to the active region by filling the space between the spacers of sidewalls of the contact area with a conductive material before forming the second conductive line layer.

According to another aspect of the inventive concepts, there is provided a method of fabricating a semiconductor device comprising a contact, the method including the operations of forming a first conductive line layer comprising a plurality of first conductive lines having a linear shape in a first direction to be spaced apart from each other along a second direction perpendicular to a first direction, on a semiconductor substrate in which active regions having an oblique angle with the first direction are defined; forming a first mask layer comprising a lower first mask layer and an upper first mask layer on the first conductive line layer, wherein an open area for a first contact is formed in the upper first mask layer; forming a second mask layer comprising a lower second mask layer and an upper second mask layer on the first mask layer, wherein a line pattern is formed in the upper second mask layer in the second direction; forming a trench comprising a line area corresponding to the line pattern and a contact area corresponding to the open area by etching the first conductive line layer using the first mask layer and the second mask layer; forming a gap filling layer filling the line area of the trench and forming a spacer of sidewalls of the contact area of the trench; forming a first contact by filling the space between the spacers of sidewalls of the contact area with a conductive material; and forming a second conductive line layer formed in a linear shape in the second direction and electrically connected to the active region via the first contact, on the gap filling layer.

According to another aspect of the inventive concepts, there is provided a method of fabricating a semiconductor device, the method including the operations of defining an active region of a bar shape having an oblique angle with a first direction in a substrate; forming a first conductive line layer comprising a plurality of first conductive lines which contact with the active region and extend in the first direction; and partitioning each of the first conductive lines to form a plurality of landing pads by forming linear trenches in a second direction perpendicular to the first direction using a multi-layered etch mask, wherein the landing pads are aligned in a zigzag line with respect to the second direction.

After forming the landing pads, the method may further include the operations of forming a gap filling layer filling the trenches; and forming a second conductive line formed in a linear shape in the second direction and electrically connected to the active region, on the gap filling layer, wherein the trenches comprise a contact area exposing the active region, wherein the contact area comprises a spacer of sidewalls and a contact filling the space between the spacers of sidewalls

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF EXAMPLE EMBODIMENTS

Figure 1:
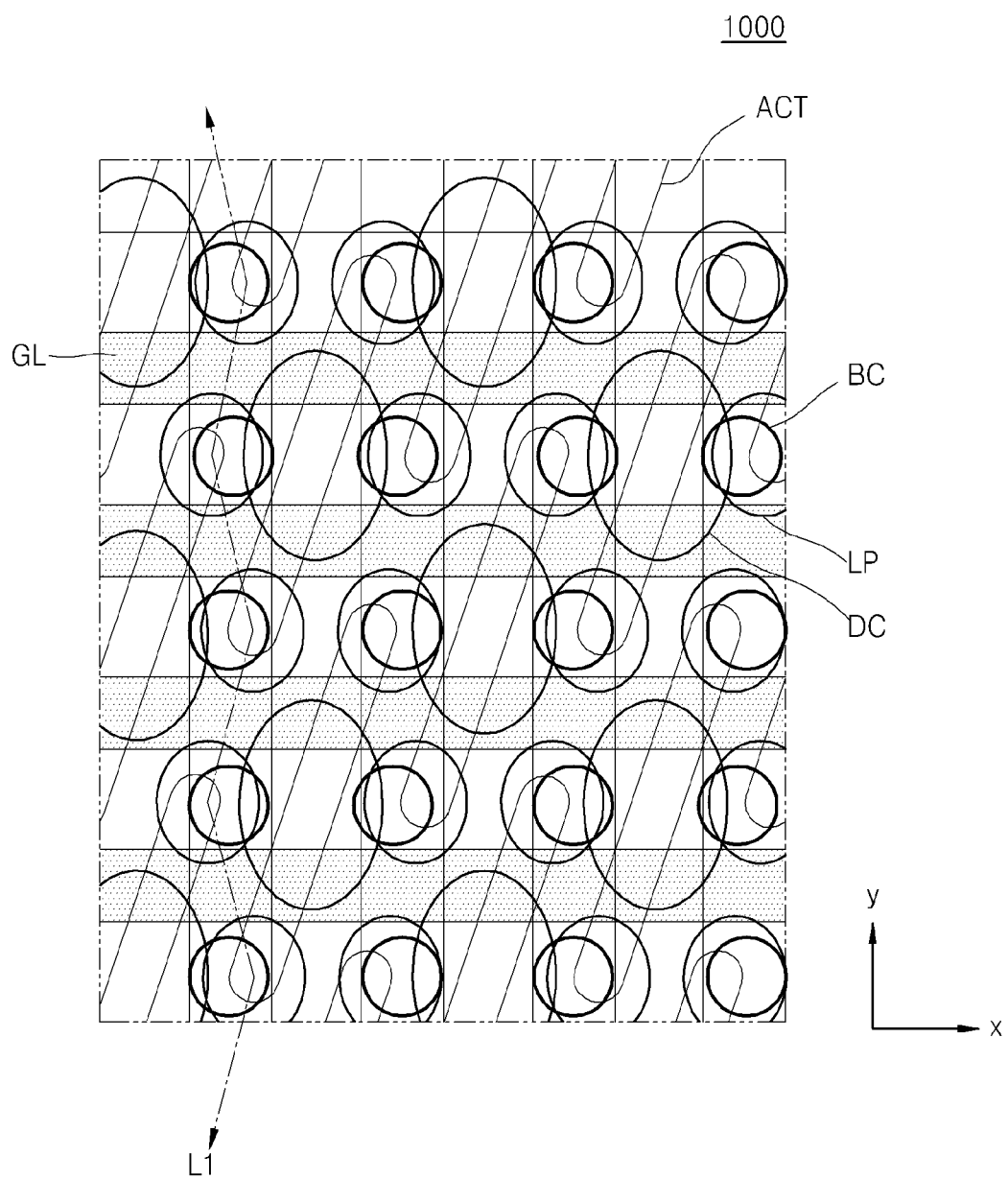
FIG. 1 is a layout of a semiconductor device including an asymmetrical pattern, according to example embodiments of the inventive concepts.

Example embodiments will be described more fully hereinafter with reference to the accompanying drawings, in which example embodiments are shown. The present invention may, however, be embodied in many different forms and should not be construed as limited to example embodiments as set forth herein. Rather, example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers that may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made in detail to example embodiments, examples of which are illustrated in the accompanying drawings. It will be understood that when an element, such as a layer, a region, or a substrate, is referred to as being "on," "connected to" or "coupled to" another element, it may be directly on, connected or coupled to the other element or intervening elements may be present. In the drawings, like reference numerals refer to like elements, and the size of each component is exaggerated for convenience and clarity. However, example embodiments are not limited to the embodiments illustrated hereinafter, and the embodiments herein are rather introduced to provide easy and complete understanding of the scope and spirit of example embodiments.

FIG. 1 is a layout of a semiconductor device 1000 including an asymmetrical pattern, according to example embodiments of the inventive concepts.

Referring to FIG. 1, the semiconductor device 1000 includes active regions ACT defined by a device isolation layer (not shown) and a variety of contact arrays, for example, direct contacts DC, buried contacts BC, and landing pads LP, which are disposed on the active regions ACT.

The active regions ACT may be disposed in the shape of diagonal or oblique bars as a design rule of the semiconductor device 1000 is reduced. In other words, the active regions ACT may have an angle less than 90° with a gate line GL formed in the semiconductor device 1000 and extending in the x-axis direction. In example embodiments, the angle may or may not be predetermined.

As described above, the contact arrays may include direct contacts DC, buried contacts BC, and landing pads LP. In this regard, the direct contacts DC refers to a contact connecting the active region ACT to a bit line (not shown), and the buried contact BC refers to a contact connecting the active region ACT to a lower electrode (not shown) of a capacitor. Also, the buried contact BC and the active region ACT may generally have a very small contact area due to the alignment structure. Accordingly, a conductive landing pad LP may be disposed between the buried contact BC and the active region ACT to reduce contact resistance caused by increasing the contact area.

In the semiconductor device 1000 according to example embodiments, the direct contact DC may be disposed in a central portion of the active region ACT, and the buried contact BC may be disposed respectively on both ends of the active region ACT. In addition, since the buried contact BC is disposed on both ends of the active region ACT, the landing pad LP may also be disposed respectively on both ends of the active region ACT.

Also, the gate line GL may be buried in a substrate of the semiconductor device 1000 to cross the active region ACT between the direct contact DC and the buried contact BC. As shown in FIG. 1, two gate lines GL may be disposed to cross one active region ACT, and the active region ACT may have an angle less than 90° with the gate line GL. In example embodiments, the angle may or may not be predetermined.

As shown in FIG. 1, the direct contacts DC and the buried contacts BC may be symmetrically aligned, and thus may be disposed in lines along the x-axis and y-axis. Such a symmetrical contact pattern may be fabricated using a mask having a crossed line pattern, for example, using a double patterning technique (DPT) including photo-etch-photo-etch (PEPE).

However, if a pattern is not symmetrically aligned, i.e., if a pattern is not linearly disposed in the x-axis nor in the y-axis, it is difficult to apply the DPT using the crossed line pattern.

In the layout of the semiconductor device 1000 of FIG. 1, the landing pads LP have an asymmetrical pattern. That is, the landing pads LP are aligned in a zigzag line L1 with respect to the y-axis. According to example embodiments, if the landing pads LP are asymmetrically aligned in the zigzag line L1, the DPT using a line pattern may be applied to align the landing pads LP.

Hereinafter, a method of asymmetrically forming the landing pads LP is described with reference to FIGS. 2A to 15.

Even though the DPT is applied to the asymmetrically aligned landing pads LP according to example embodiments, the application of the DPT is not limited to the landing pads LP and may also be applied to any asymmetrically aligned pattern.

FIGS. 2A to 14C are plan views and cross-sectional views for describing a method of fabricating of the semiconductor device 1000 of FIG. 1, according to example embodiments of the inventive concepts. Here, FIGS. 2B, 3B, 4B, 5B, 6B, 7B, 8B, 9B, 10B, 11B, 13B, and 14B and FIGS. 2C, 3C, 4C, 5C, 6C, 7C, 8C, 9C, 10C, 11C, 13C, and 14C are cross-sectional views respectively taken along lines I-I' and II-II' of plan views of FIGS. 2A, 3A, 4A, 5A, 6A, 7A, 8A, 9A, 10A, 11A, 13A, and 14A, respectively.

Figure 2A:
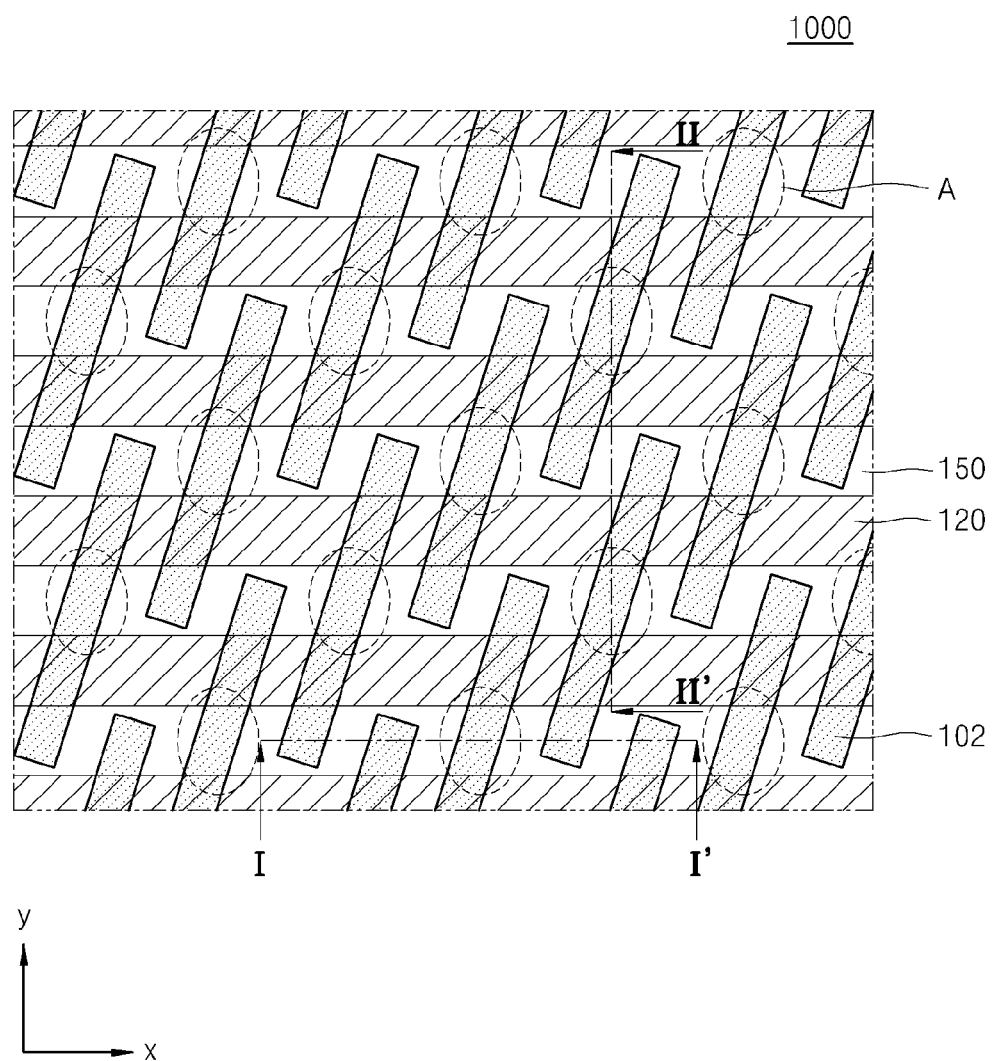
FIGS. 2A to 14C are plan views and cross-sectional views for describing a method of fabricating the semiconductor device of FIG. 1.
Figure 2B:
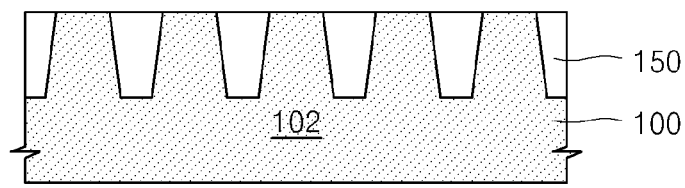
Figure 2C:
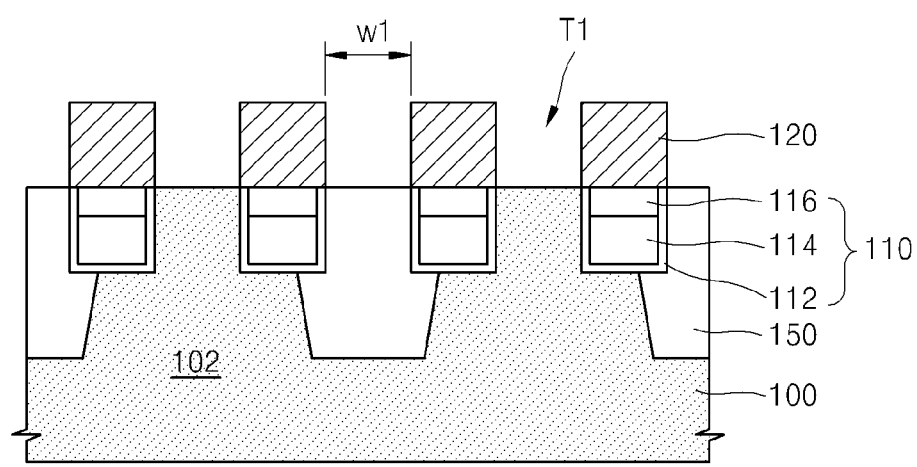

Referring to FIGS. 2A to 2C, active regions 102 may be defined by a device isolation layer 150 in a semiconductor substrate 100, and a buried gate structure 110 may be formed in the semiconductor substrate 100. The active region 102 may have a diagonal or oblique bar shape having an angle with the x-axis as shown in FIG. 2A. In example embodiments, the angle may or may not be predetermined. A dashed line circle A of FIG. 2A corresponds to a direct contact area to be formed later.

The buried gate structure 110 may include a gate insulating layer 112, a gate electrode 114, and a gate capping layer 116, and may extend in the x-axis direction across the active region 102. The buried gate structure 110 indicates the gate line GL of FIG. 1.

A first interlayer insulating layer 120 is formed on the semiconductor substrate 100 including the buried gate structure 110. The first interlayer insulating layer 120 may be patterned in a linear pattern to form first trenches T1. The first trenches T1 extend in the x-axis direction and may expose upper surfaces of the active regions 102 and the device isolation layer 150 of the semiconductor substrate 100.

The first trenches T1 may have a first width W1 in the y-axis direction, and the first width W1 may be the same as a y-axis direction width of the first interlayer insulating layer 120. However, the widths of the first trenches T1 and the first interlayer insulating layer 120 are not limited thereto, and the first trench T1 and the first interlayer insulating layer 120 may also have different widths. For example, the y-axis direction width of the first trench T1 may be greater than the y-axis direction width of the first interlayer insulating layer 120.

Figure 3A:
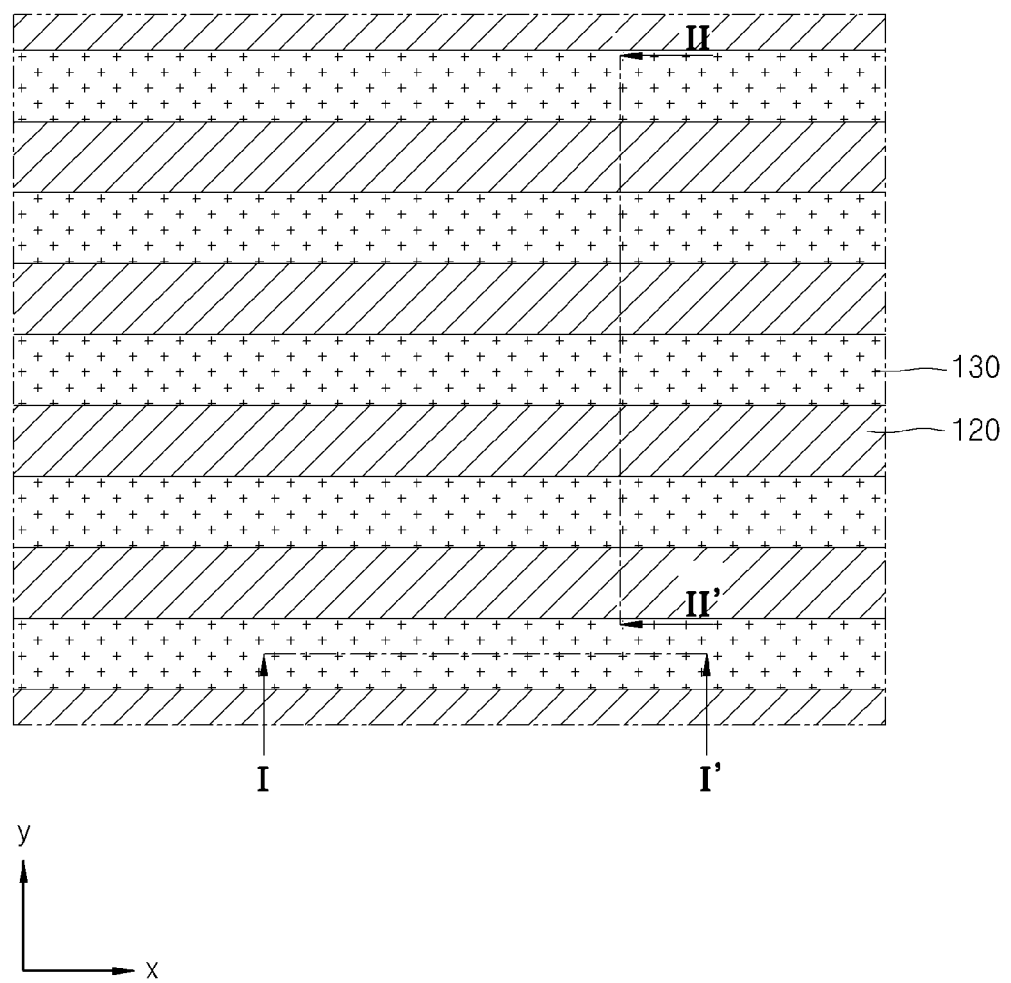
Figure 3B:
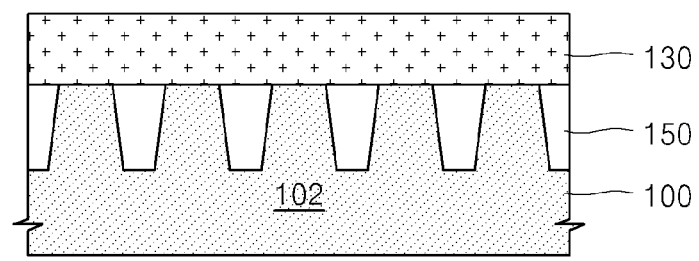
Figure 3C:
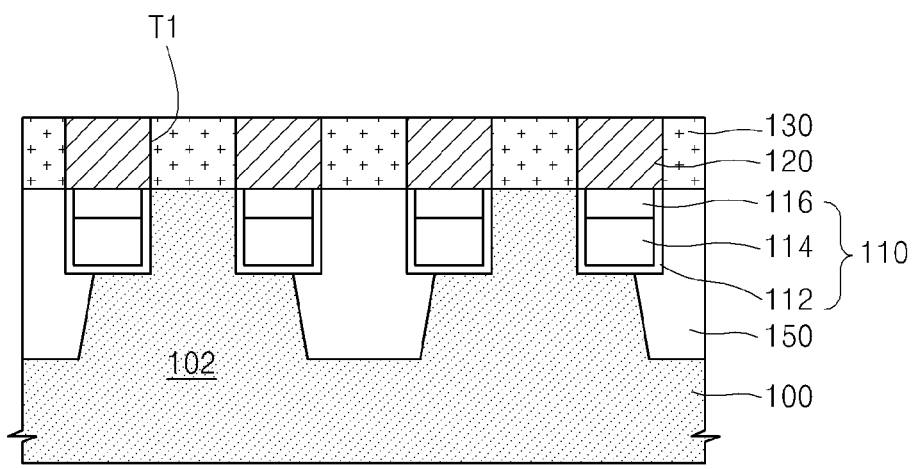

Referring to FIGS. 3A to 3C, a first conductive line layer 130 may be formed by filling the first trenches T1 using deposition of a conductive material, for example, polysilicon, on a top surface of the semiconductor substrate 100 on which the first trenches T1 are formed, and performing a planarization process, such as a chemical mechanical polishing (CMP). The first conductive line layer 130 may have the same width as that of the first trench T1 in the y-axis direction and extend in the x-axis direction.

Figure 4A:
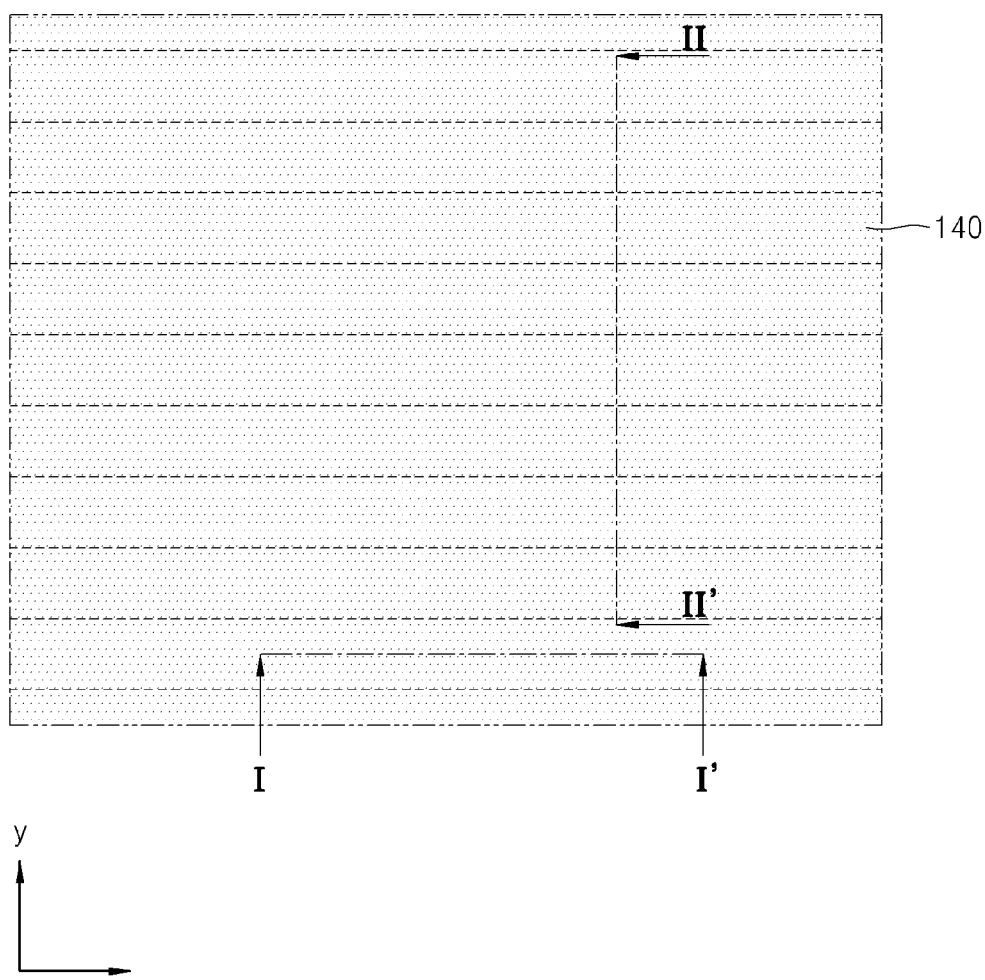
Figure 4B:
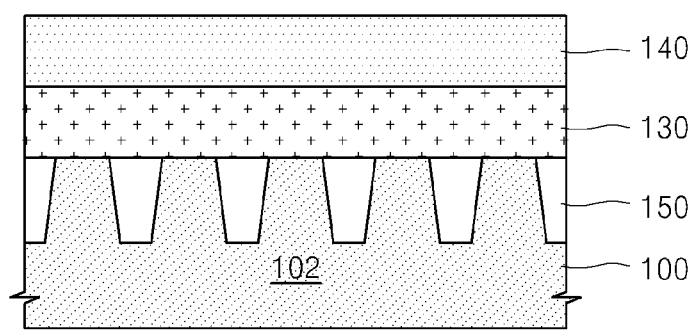
Figure 4C:
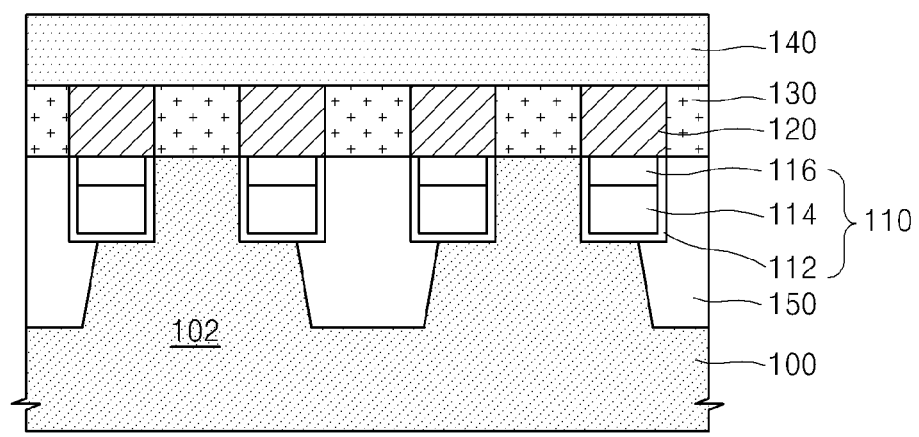

Referring to FIGS. 4A to 4C, a capping insulating layer 140 may be formed on the first conductive line layer 130 and the first interlayer insulating layer 120 to a thickness that may or may not be predetermined. The capping insulating layer 140 may be, for example, a silicon oxide layer or a silicon nitride layer.

Dashed lines in the x-axis direction of FIG. 4A are boundaries between the first conductive line layer 130 and the first interlayer insulating layer 120 formed under the capping insulating layer 140.

Figure 5A:
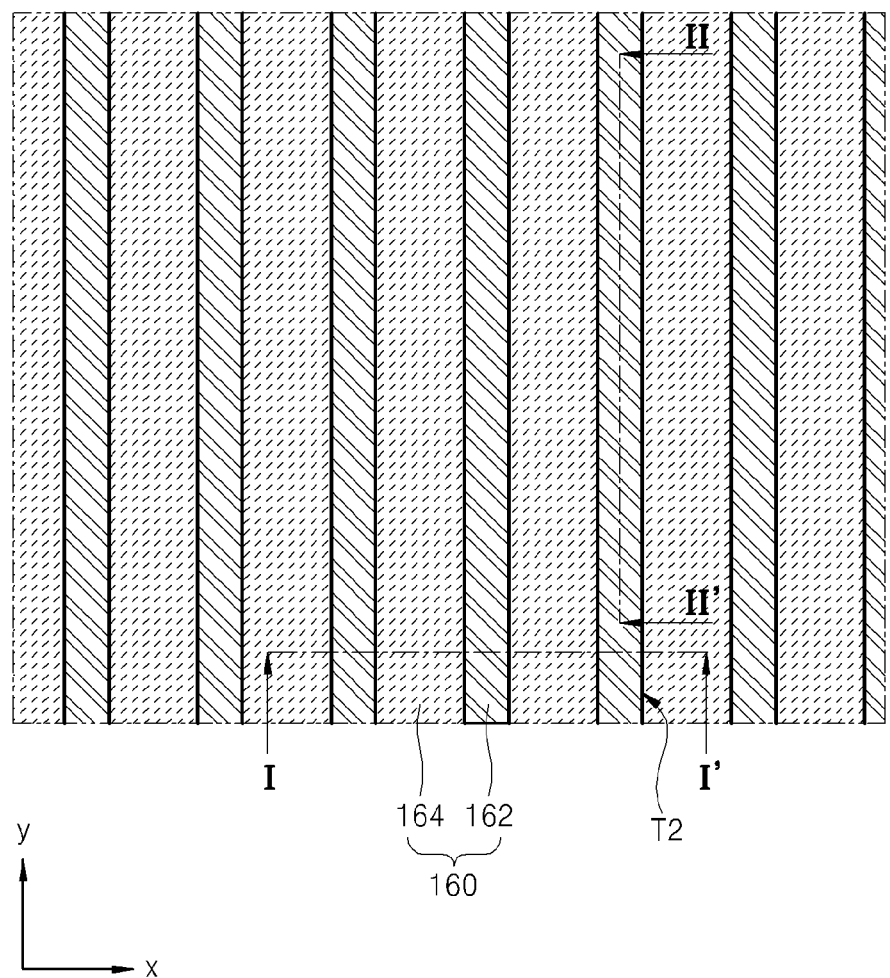
Figure 5B:
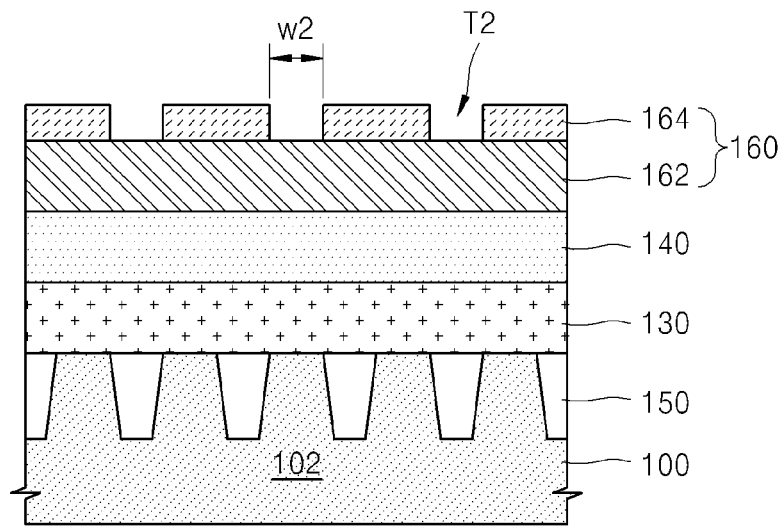
Figure 5C:
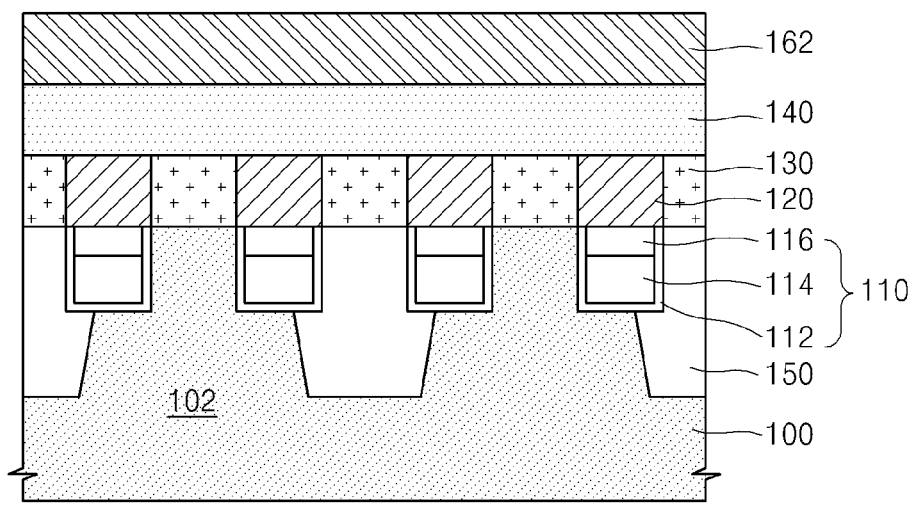

Referring to FIGS. 5A to 5C, a first mask layer 160 may be formed on the capping insulating layer 140. The first mask layer 160 may have a single layer or multi layer structure, the top layer of which has a linear pattern. If the first mask layer 160 has a multi layer structure, the first mask layer 160 may have a structure in which at least two hard mask layers having different etching characteristics under a predetermined etching condition are stacked. The first mask layer 160 may be formed of a material easily removed by using ashing and stripping processes.

For example, the first mask layer 160 may have a double layer structure including an amorphous carbon layer (ACL) 162 as a lower layer and a first silicon oxide nitride (SiON) layer 164 as an upper layer. Also, the ACL 162, as the lower layer, may be replaced with a spin-on hard mask (SOH) layer formed of a hydrocarbon composite or derivatives thereof having a relatively high carbon content of about 85 to 99% by weight based on the total weight. The ACL and SOH layer have similar chemical characteristics since they have high carbon content.

The first SiON layer 164, as the upper layer, may be patterned in a linear shape extending in the y-axis direction. Accordingly, an upper surface of the ACL 162 may be exposed by second trenches T2 of the first SiON layer 164. The first SiON layer 164 may be patterned in a linear shape and may have an anti-reflection function during a photolithography process. If desired, an organic anti-reflection layer (not shown) may further be formed on the first SiON layer 164. In this case, the first SiON layer 164 and the organic anti-reflection layer may be patterned in a linear shape together.

The x-axis direction width of the first SiON layer 164 may be twice as large as a second width W2 of the second trench T2. However, the widths of the first SiON layer 164 and the second trench T2 are not limited thereto. Also, portions in which the second trenches T2 are formed may correspond to portions in which bit lines are to be formed.

Figure 6A:
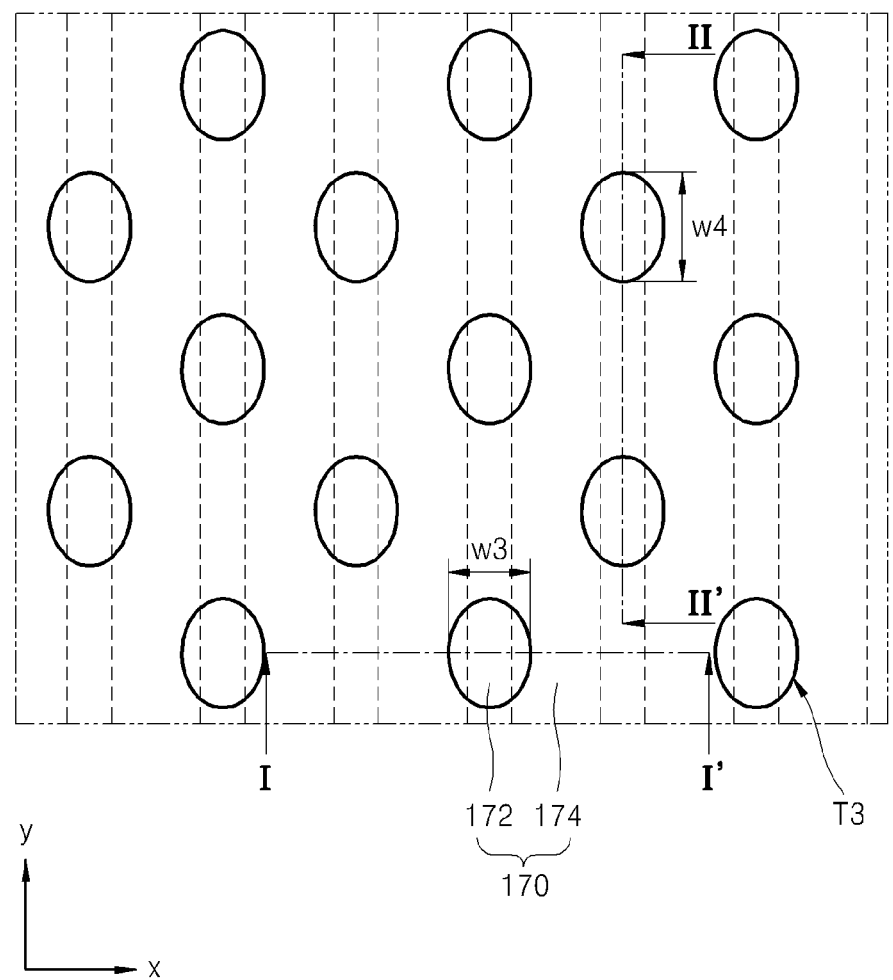
Figure 6B:
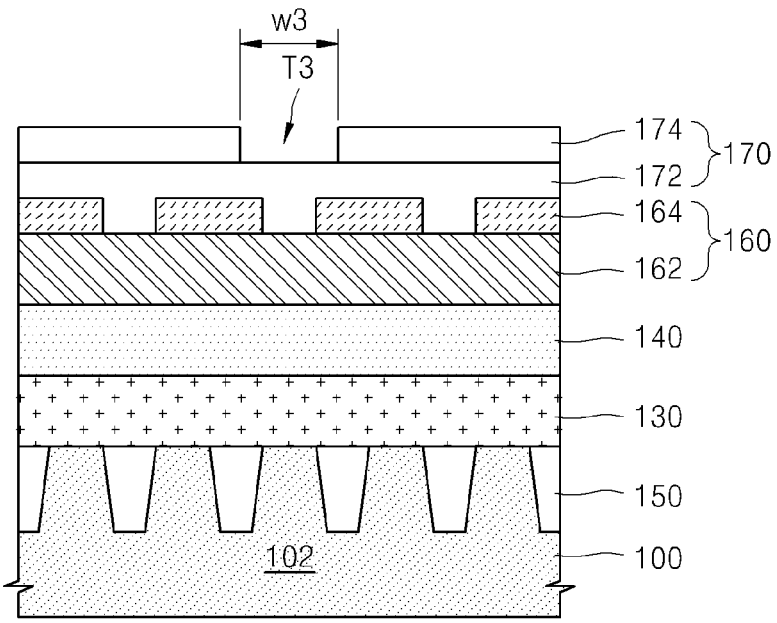
Figure 6C:
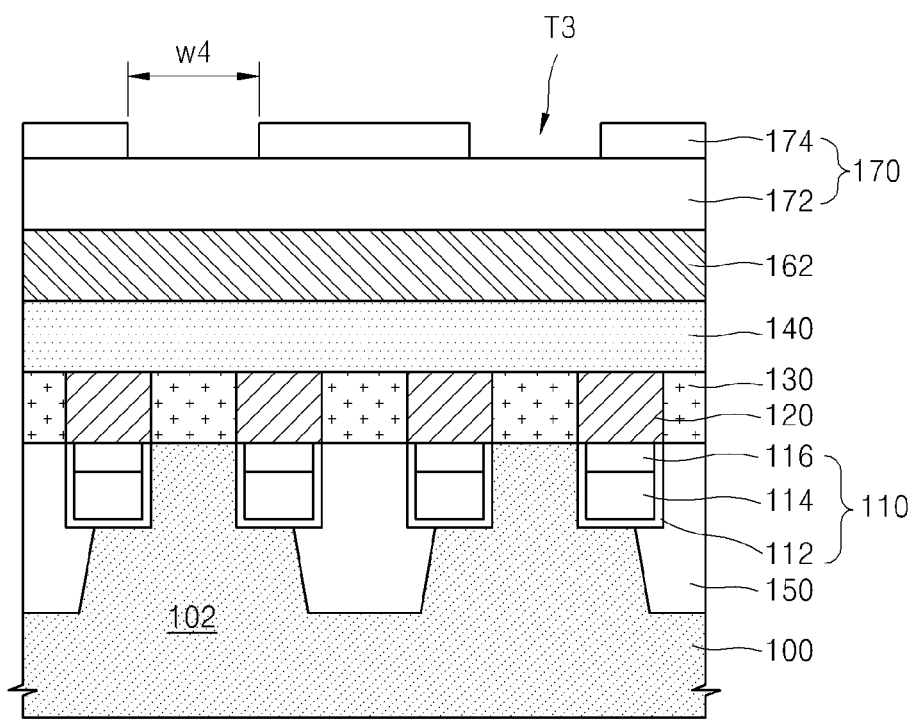

Referring to FIGS. 6A to 6C, a second mask layer 170 may be formed on the first mask layer 160. The second mask layer 170 may also have a single-layer or multi-layer structure, a top layer of which has an open area. If the second mask layer 170 has a multi layer structure, the second mask layer 170 may have a structure in which at least two hard mask layers having different etching characteristics under a predetermined etching condition are stacked. The second mask layer 170 may also be formed of a material easily removed by using ashing and stripping processes.

For example, the second mask layer 170 may have a double layer structure including a SOH layer 172 as a lower layer and a second SiON layer 174 as an upper layer. The SOH layer 172, as the lower layer, may also be replaced with an ACL having similar chemical characteristics.

In the second SiON layer 174, as the upper layer, an open area, i.e., an opening T3, may be formed in a portion in which a direct contact DC is to be formed later. Accordingly, an upper surface of the SOH layer 172 may be exposed by the opening T3 of the second SiON layer 174. The second SiON layer 174 may also perform an anti-reflection function during a photolithography process and may have an organic anti-reflection layer (not shown) formed thereon. If the organic anti-reflection layer (not shown) is formed, the organic anti-reflection layer may also be patterned to form the opening T3.

The opening T3 may have a third width W3 in the x-axis direction and a fourth width W4 in the y-axis direction. The third width W3 may be less than the fourth width W4. However, example embodiments are not limited thereto, and the third width W3 and the fourth width W4 may be the same or the fourth width W4 may be less than the third width W3. In addition, the x-axis direction third width W3 of the opening T3 may be greater than the second width W2 of the second trench T2 of the first SiON layer 164 formed under the second mask layer 170. For example, the third width W3 of the opening T3 may be twice as large as the width of the second trench T2 of the first SiON layer 164.

Figure 7A:
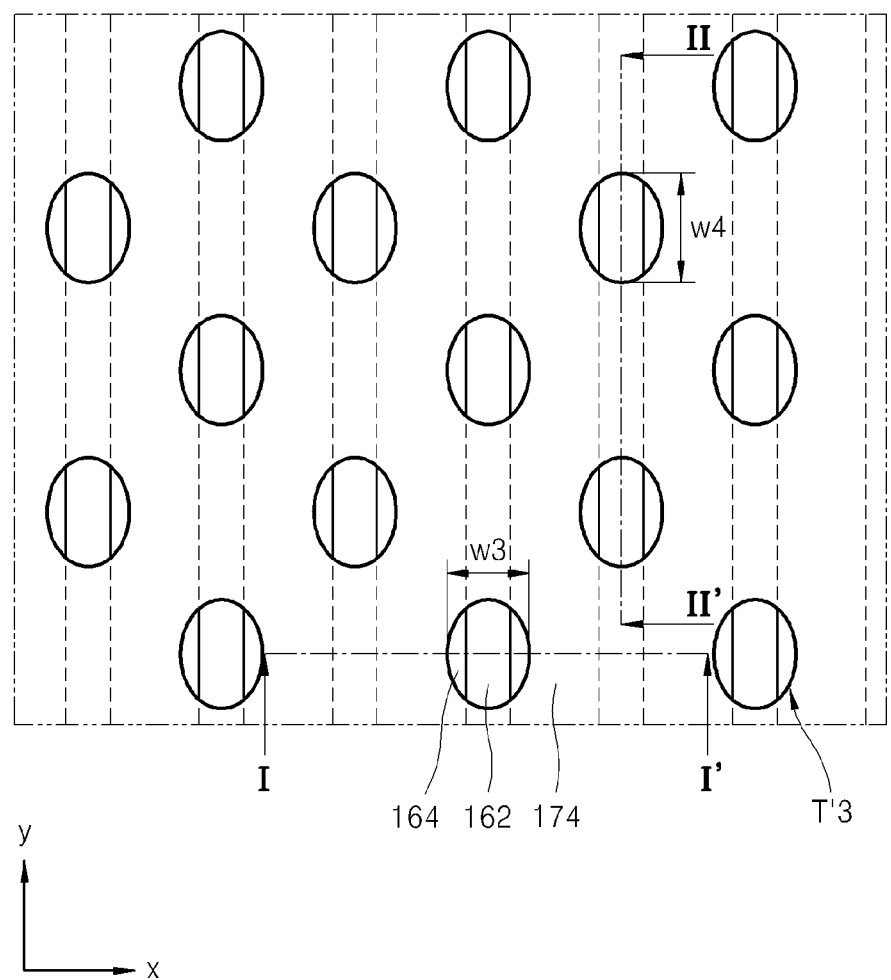
Figure 7B:
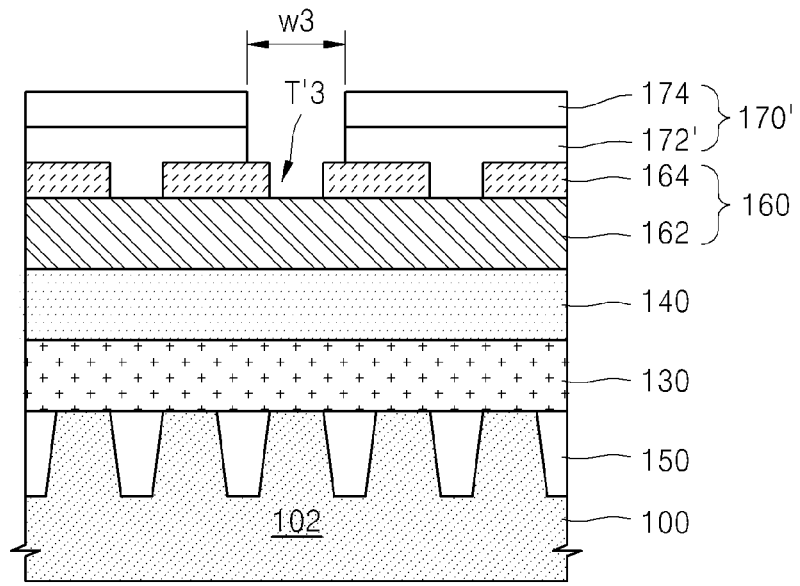
Figure 7C:
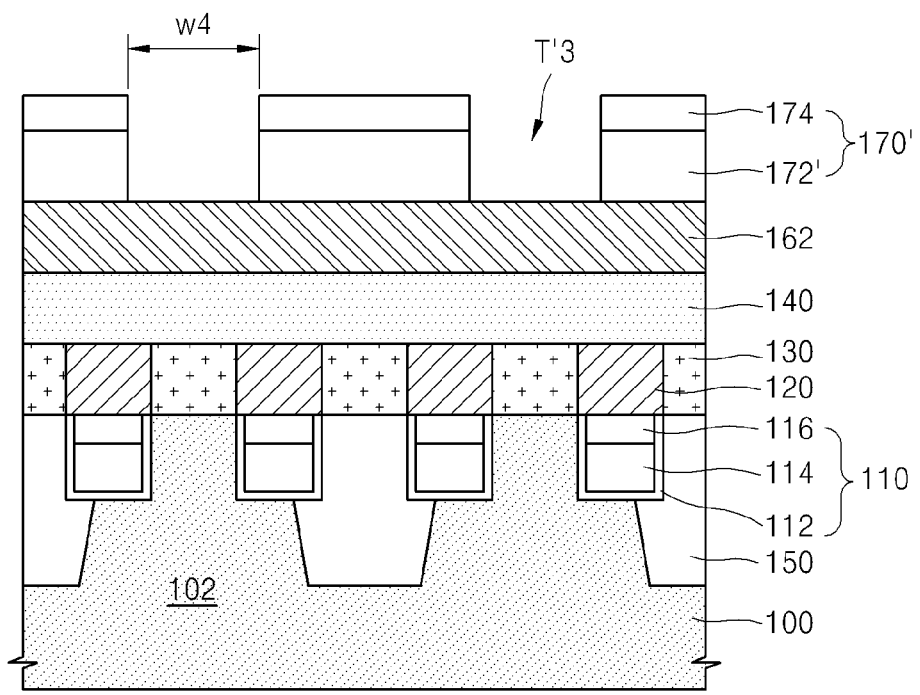

Referring to FIGS. 7A to 7C, the SOH layer 172 is etched using the second SiON layer 174 as a mask. After etching, an upper surface of the ACL 162 and a portion of the first SiON layer 164 may be exposed via the opening T'3 of the second mask layer 170'. In other words, as shown in FIG. 7A, since the third width W3 of the opening T3 in the x-axis direction is greater than the second width W2 of the second trench T2 of the first SiON layer 164, a portion of the first SiON layer 164 may be exposed at both sides of the opening T'3. In this regard, 172' is a SOH layer after etching.

Figure 8A:
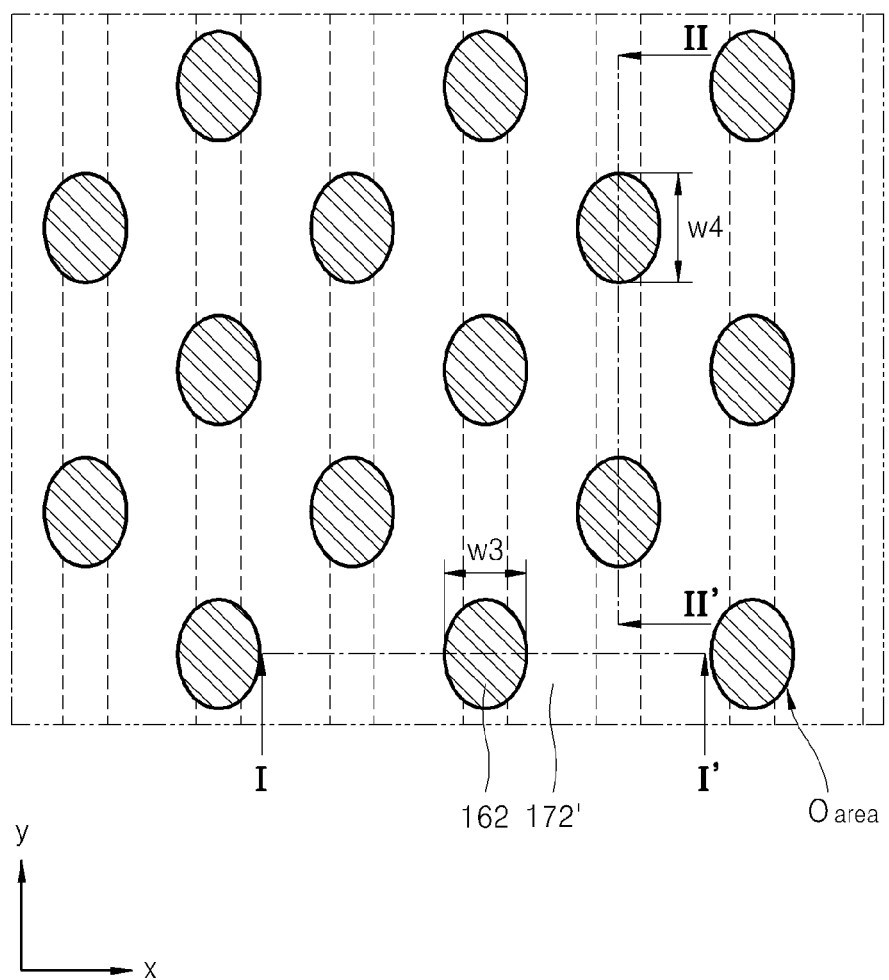
Figure 8B:
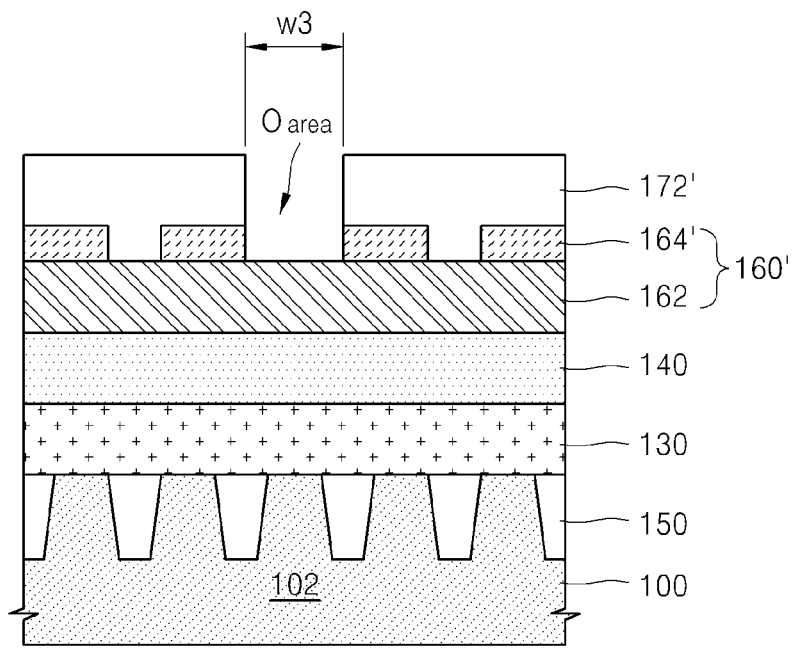
Figure 8C:
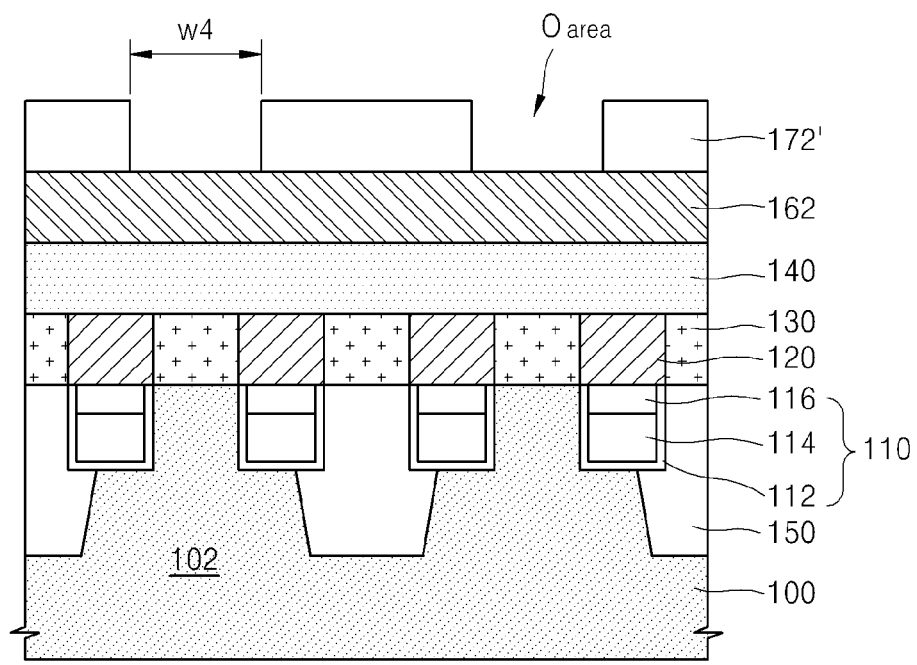

Referring to FIGS. 8A to 8C, the first SiON layer 164 may be etched using the etched SOH layer 172' as a mask. After etching the first SiON layer 164, an open area Oarea corresponding to the width of the opening T'3 may be formed in a first SiON layer 164'. In other words, an x-axis direction width of the open area Oarea may have a third width W3 which is the same as the x-axis direction width of the opening T3' which is formed in the second mask layer 170'. The ACL 162 may be exposed by the open area Oarea.

Also, the topmost second SiON layer 174 may be removed during an etching process of the first SiON layer 164 using the SOH layer 172' as a mask. In this regard, 160' is a first mask layer including the etched first SiON layer 164'.

Figure 9A:
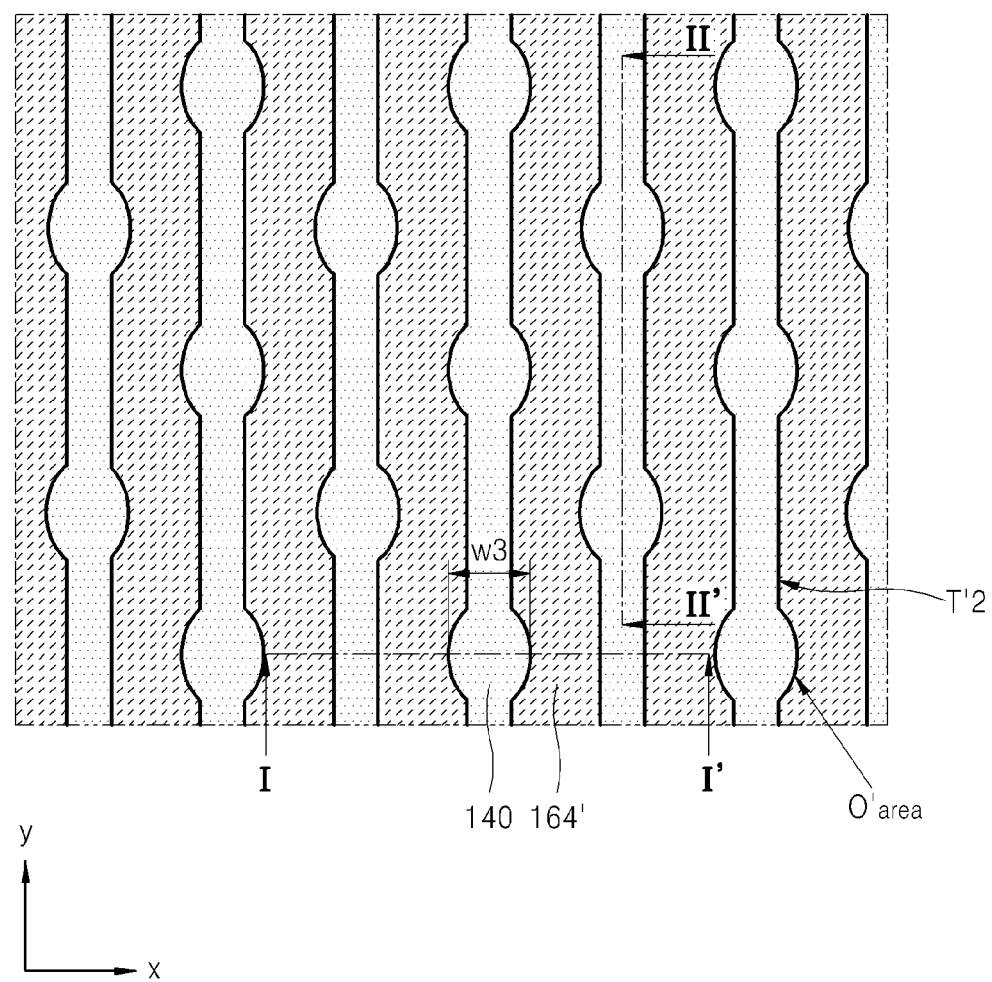
Figure 9B:
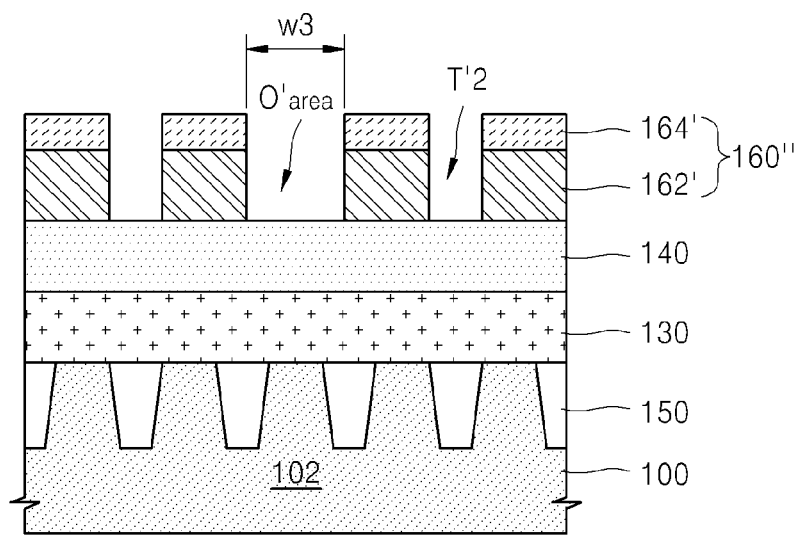
Figure 9C:
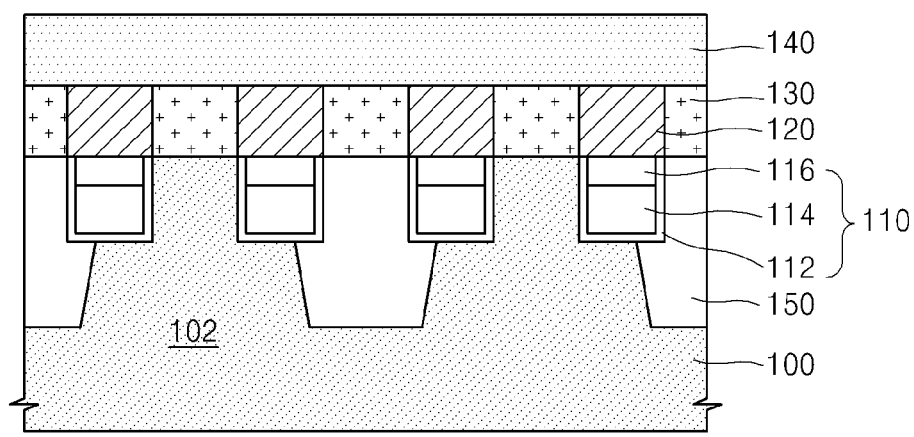

Referring to FIGS. 9A to 9C, the ACL 162 is etched using the etched first SiON layer 164' as a mask. After etching the ACL 162, the capping insulating layer 140 may be exposed via an open area O'area and second trenches T'2.

The SOH layer 172' may be removed by using an ashing or stripping process before etching the ACL 162. However, since the SOH layer 172' and an ACL 162' have similar chemical characteristics as described above, the SOH layer 172' may be removed using an etchant during the etching process of the ACL 162. In this regard, 160" is a first mask layer including the etched first SiON layer 164' and the etched ACL 162'.

Figure 10A:
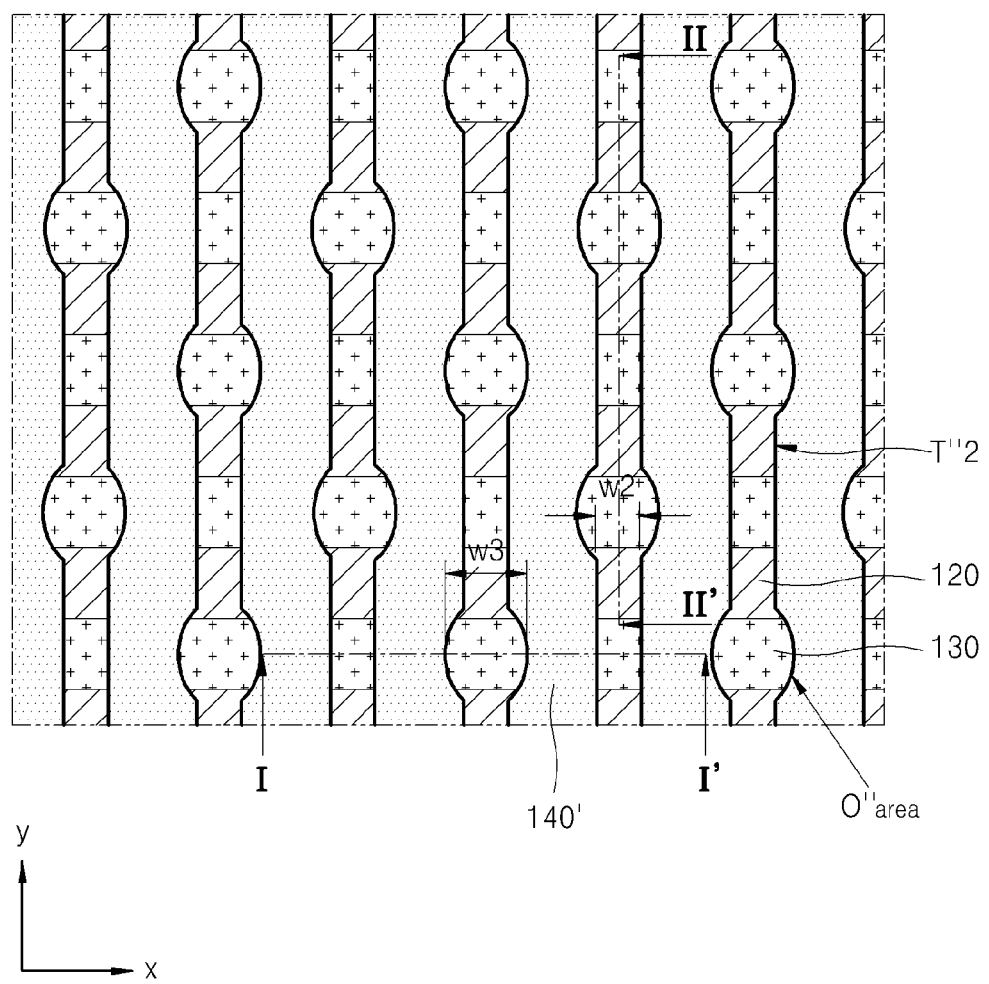
Figure 10B:
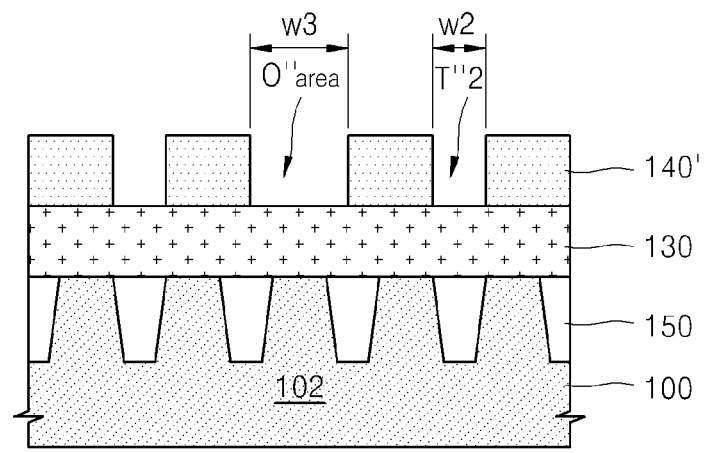
Figure 10C:
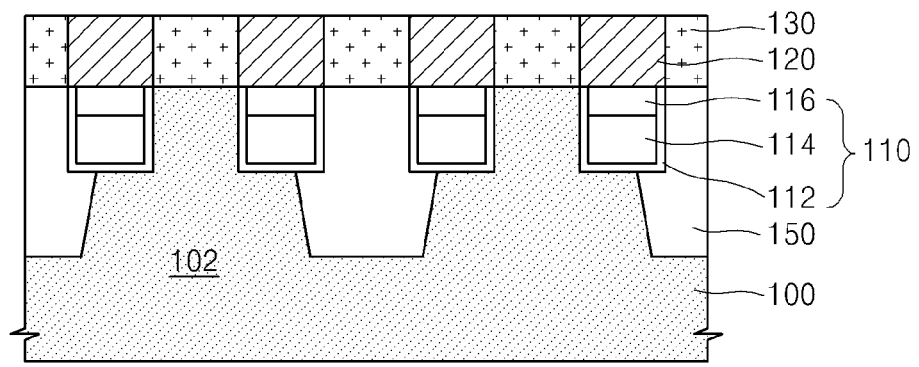

Referring to FIGS. 10A to 10C, the capping insulating layer 140 is etched using the first mask layer 160" as mask. After etching, the first conductive line layer 130 and the first interlayer insulating layer 120 may be exposed by second trenches T"2 and an open area O"area of the first mask layer 160". In particular, referring to FIG. 10A, the first conductive line layer 130 is exposed by the open area O"area. Then, the first mask layer 160" may be removed by using an ashing or strip process. The first mask layer 160" may also be removed after etching the first interlayer insulating layer 120 and the first conductive line layer 130.

FIGS. 10A to 10C show the semiconductor device after removing the first mask layer 160". Accordingly, a capping insulating layer 140' patterned to a shape corresponding to the first mask layer 160" is shown. The first conductive line layer 130 and the first interlayer insulating layer 120 may be exposed by the second trenches T"2 and the open area O"area of the capping insulating layer 140'.

Also, the width of second trenches T"2 between the capping insulating layer 140' in the x-axis direction may be the same as the second width W2 of the second trenches T2 in the x-axis direction shown in FIG. 5A or 5B. In addition, the x-axis direction width of the open area O"area between the second trenches T"2 may be a third width W3 which is the same as the x-axis direction width of the opening T3 of the second SiON layer 174 as shown in FIG. 6A or 6B.

Figure 11A:
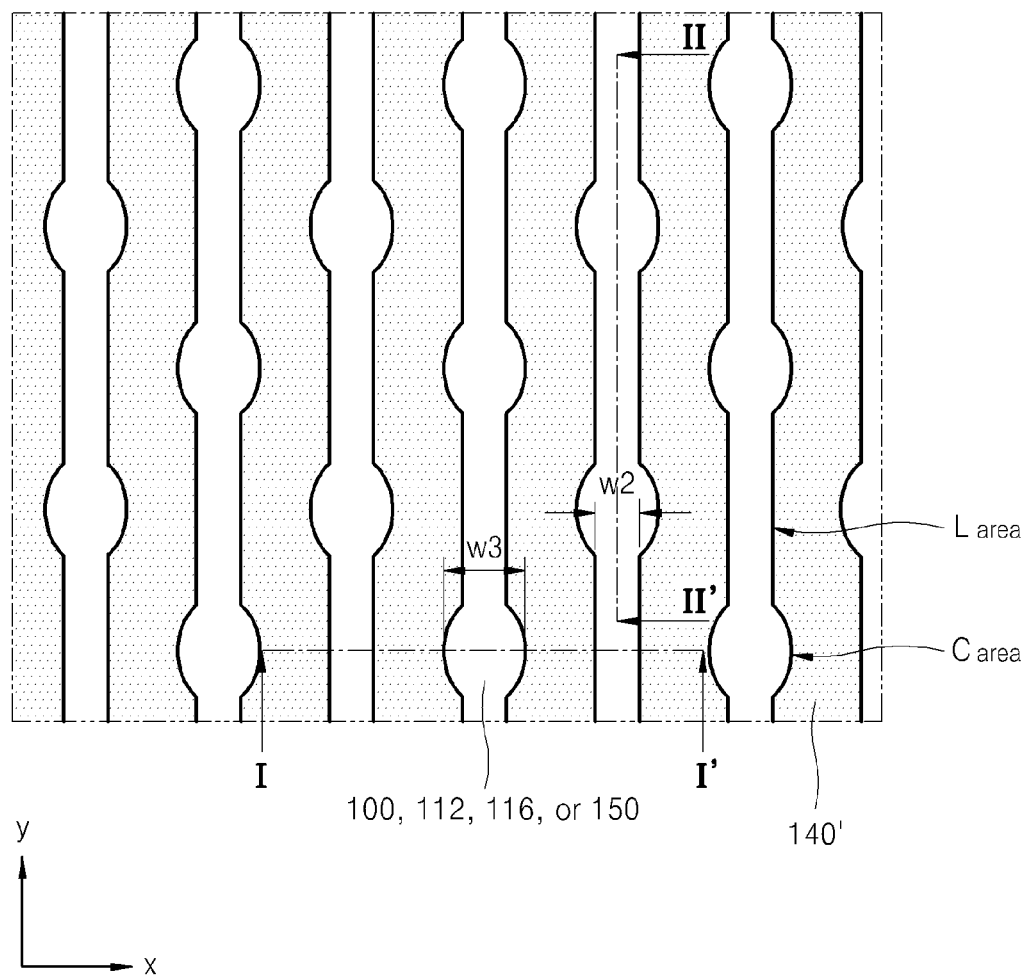
Figure 11B:
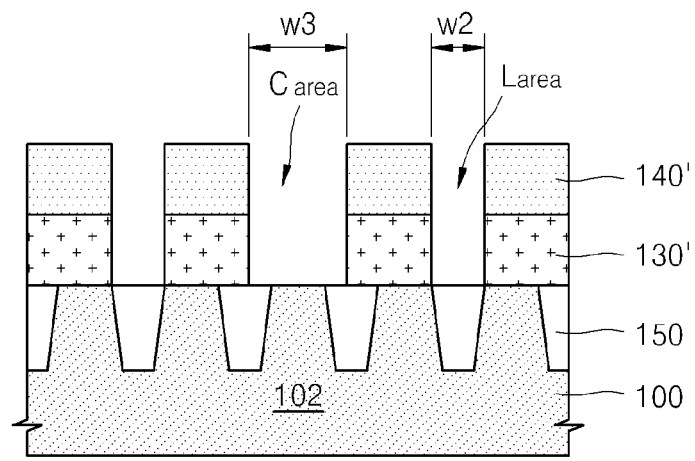
Figure 11C:
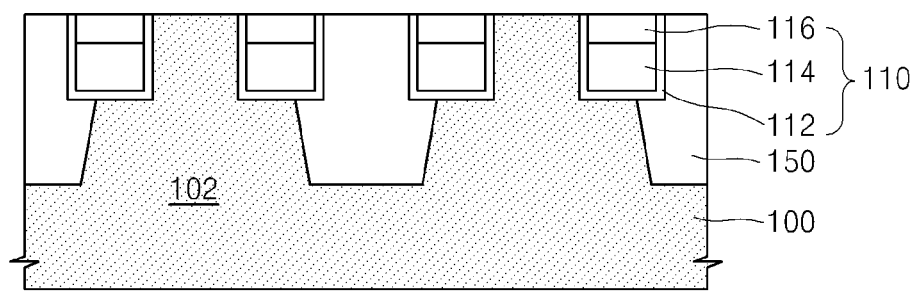

Referring to FIGS. 11A to 11C, the first interlayer insulating layer 120 and the first conductive line layer 130 are etched using the capping insulating layer 140' as a mask. After etching, a line area Larea corresponding to the second trench T"2 and a contact area Carea corresponding to the open area O"area may be formed in the first conductive line layer 130'. The upper surfaces of the active region 102, the device isolation layer 150, and the buried gate structure 110 of the semiconductor substrate 100 may be exposed by the line area Larea and the contact area Carea. In the buried gate structure 110, the gate insulating layer 112 and the gate capping layer 116 may be exposed. In addition, the x-axis direction widths of the line area Larea and the contact area Carea may respectively have the second width W2 and the third width W3.

Figure 12:
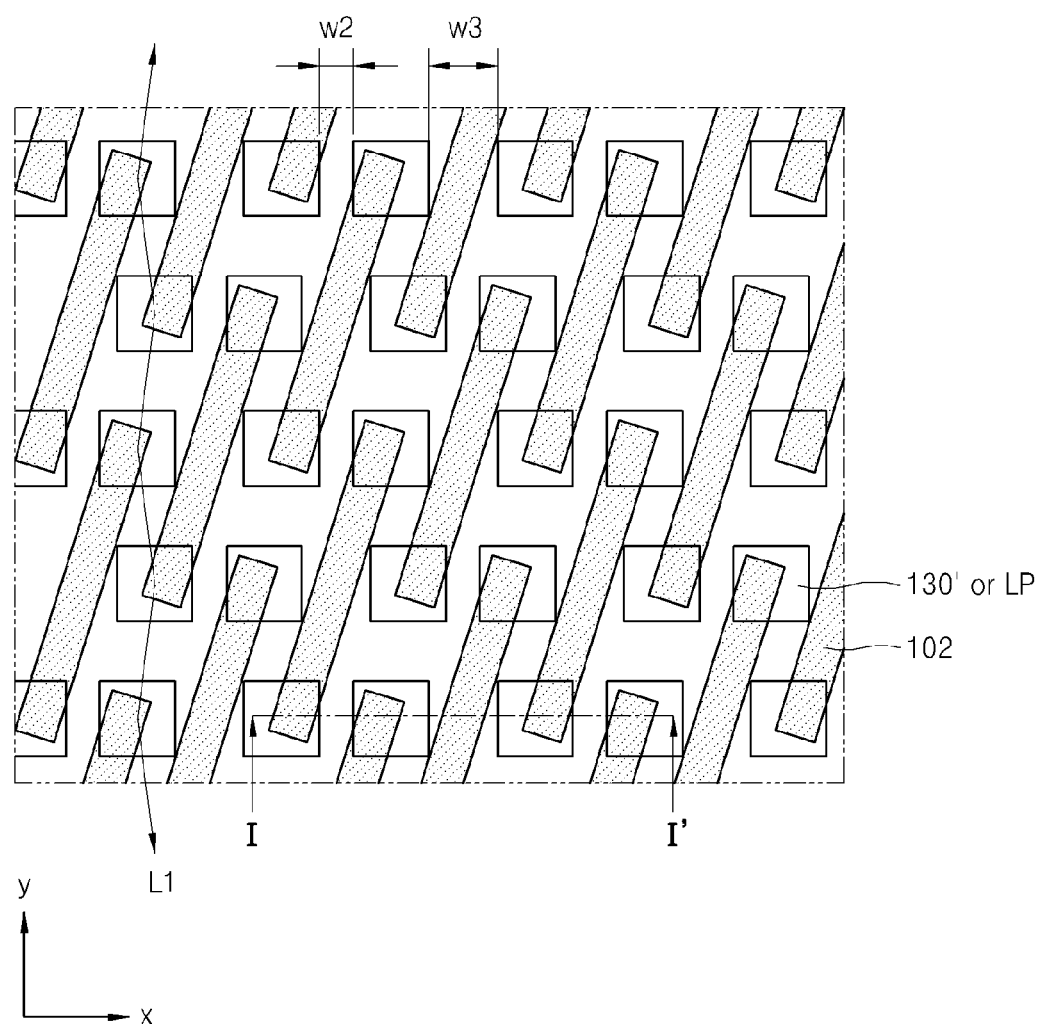

FIG. 12 is a plan view illustrating the relation of positions of the landing pads LP after the line area Larea and the contact area Carea of FIGS. 11A to 11C are formed.

Referring to FIGS. 11A to 11C, after the line area Larea and the contact area Carea are formed, the first conductive line layer 130' is partitioned by the line area Larea and the contact area Carea to form a plurality of landing pads LP. In other words, the first conductive line layer 130' is patterned in a linear shape in the x-axis direction as shown in FIGS. 3A to 3C, and thus, insulated in the y-axis direction. In addition, since the line area Larea and the contact area Carea are formed in the first conductive line layer 130' by etching using the capping insulating layer 140' as a mask, the first conductive line layer 130' is partitioned in the x-axis direction by the plurality of landing pads LP to be insulated.

Also, the intervals between the landing pads LP vary in the x-axis direction. That is, the landing pads LP may be alternately disposed at a narrow interval of the second width W2 and at a wide interval of third width W3 in the x-axis direction. This is because the line area Larea having the narrow interval and the contact area Care having the wide interval are alternately aligned in the x-axis direction. As a result, the landing pads LP are asymmetrically aligned in the y-axis direction while forming a zigzag line L1.

According to example embodiments, the landing pads LP may be asymmetrically formed along the zigzag line L1 by using the DPT using the mask having a crossed line mask shape. As described above, the DPT according to example embodiments may also be applied not only to the landing pads LP but also any other patterns asymmetrically formed.

Figure 13A:
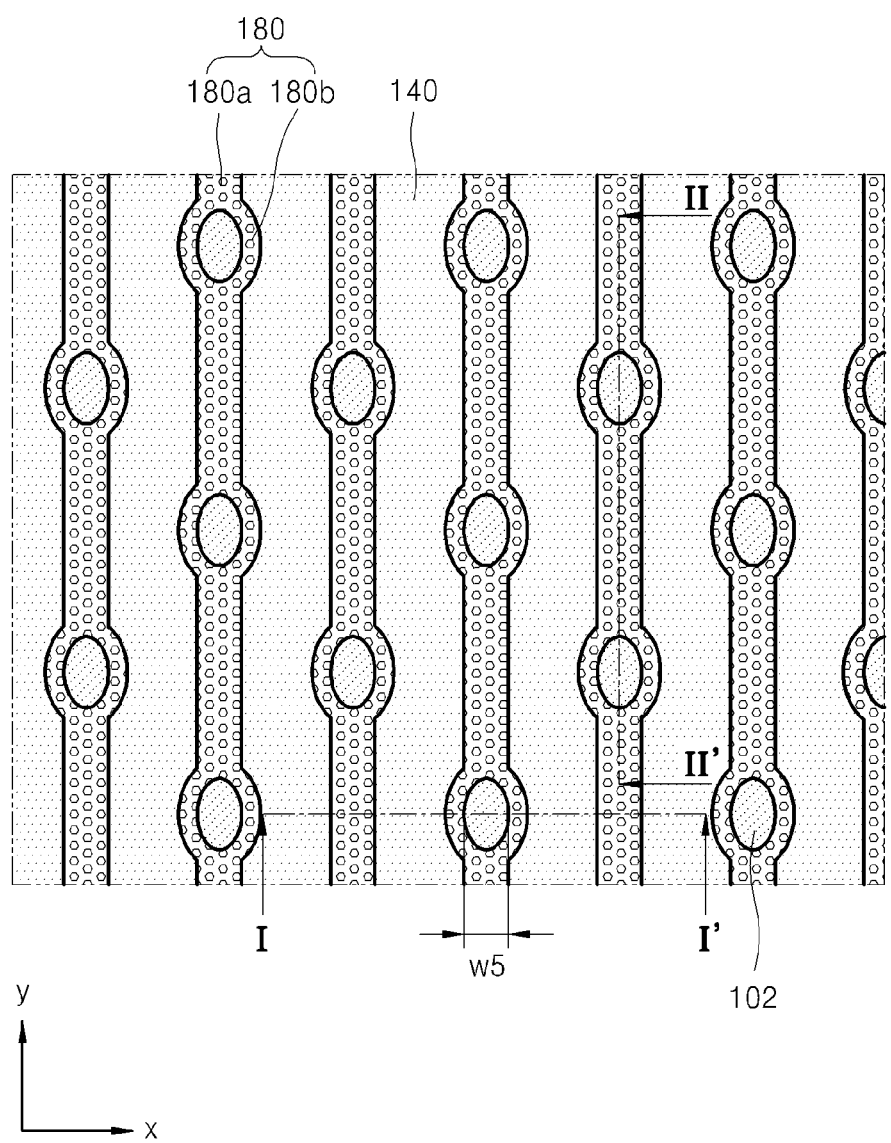
Figure 13B:
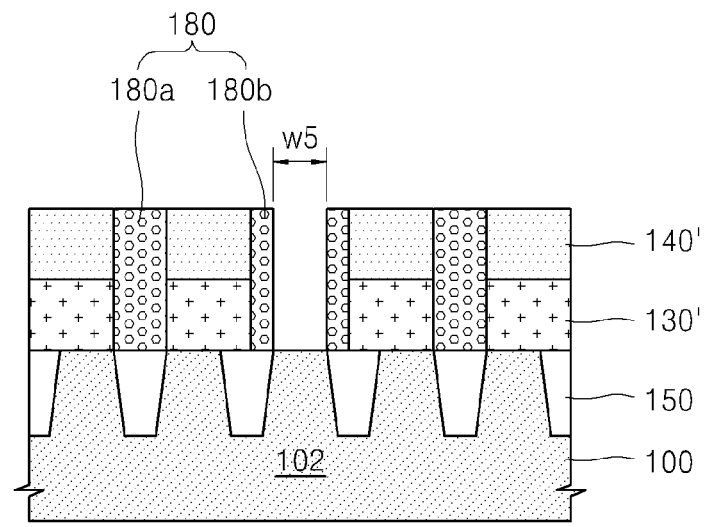
Figure 13C:
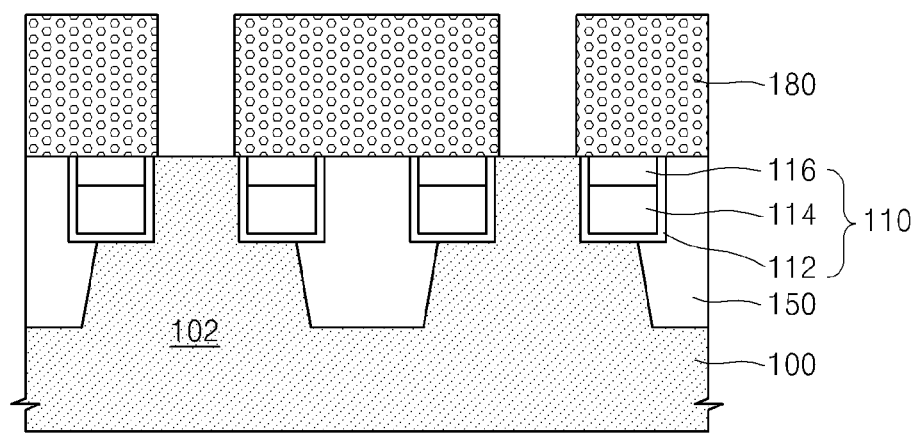

Referring to FIGS. 13A to 13C, an insulating layer (not shown) is formed on the top surface of the semiconductor substrate 100 in which the trenches including the line area Larea and the contact area Carea are formed. The insulating layer may have a thickness so as to completely fill the line area Larea and partially fill the contact area Carea. For example, the insulating layer may be formed of silicon nitride (SiN).

Then, an etch back process may be performed on the insulating layer. After the etch back process, a gap filling insulating layer 180 including a gap filling layer 180a that fills the line area Larea and a spacer 180b surrounding the sidewalls of the contact area Carea is formed. After the spacer 180b is formed in the contact area Carea, the x-axis direction width of the contact area Carea may have a fifth width W5. The fifth width W5 may correspond to the x-axis direction width of the second trench T2 of the first SiON layer 164 of FIG. 5A or 5B or an x-axis direction width of the gap filling layer 180a. Also, after the spacer 18b is formed in the contact area Carea, the active regions 102 may be exposed between the spacers 180b of the contact area Carea.

Then, an etch back process may be performed on the insulating layer. After the etch back process, a gap filling insulating layer 180 including a gap filling layer 180a that fills the line area Larea and a spacer 180b surrounding the sidewalls of the contact area Carea is formed. After the spacer 180b is formed in the contact area Carea, the x-axis direction width of the contact area Carea may have a fifth width W5. The fifth width W5 may correspond to the x-axis direction width of the second trench T2 of the first SiON layer 164 of FIG. 5A or 5B or an x-axis direction width of the gap filling layer 180a. Also, after the spacer 180b is formed in the contact area Carea, the active regions 102 may be exposed between the spacers 180b of the contact area Carea.

In other words, after the second interlayer insulating layer 210 is formed, trenches (not shown) corresponding to the gap filling insulating layer 180 are formed. The gap filling insulating layer 180 and the direct contacts 195 may be exposed by the trenches. After the trenches are formed, the bit lines 190 may be formed by filling the trenches with a conductive material, for example, a metallic material. Alternatively, the bit lines 190 may be formed by depositing a metallic layer on the resultant structure of the semiconductor substrate 100 in which the direct contacts 195 are formed and patterning the metallic layer to correspond to the gap filling insulating layer 180.

The bit lines 190 may extend in the y-axis direction as the gap filling insulating layer 180 and be connected to the direct contacts 195 to be electrically connected to the active region 102.

Figure 14A:
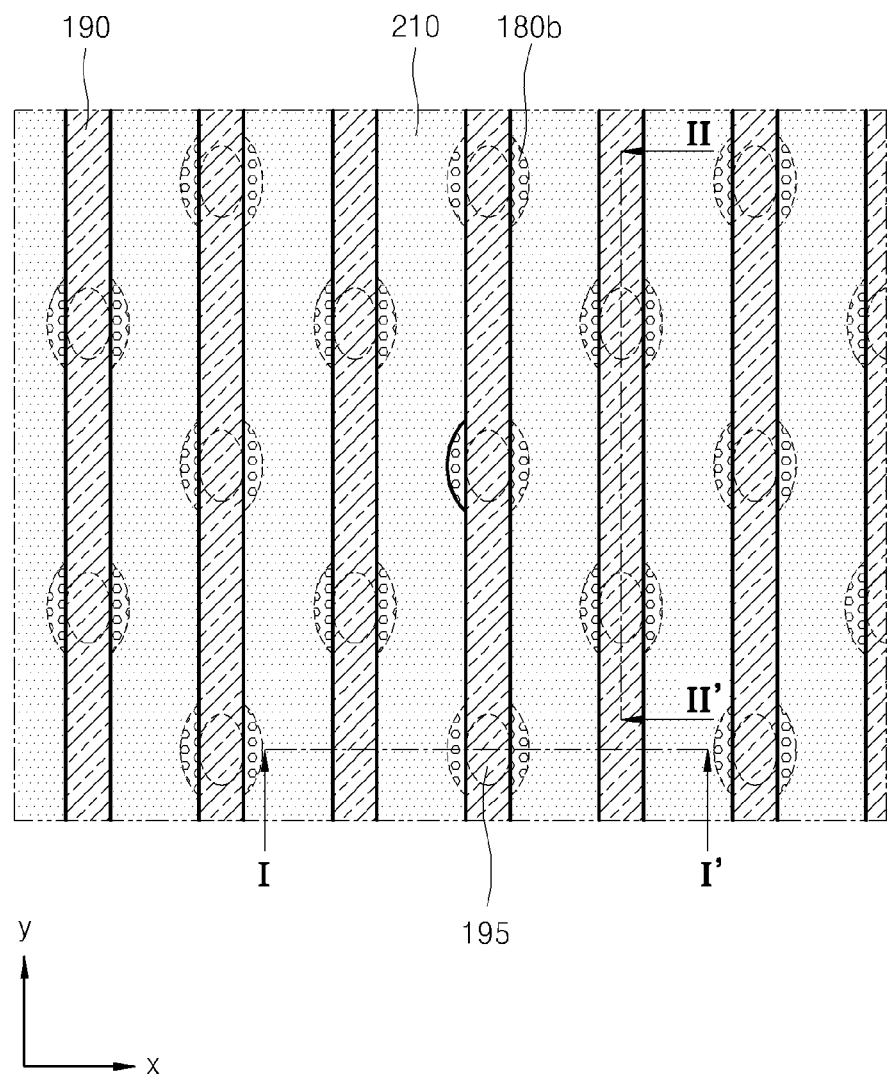
Figure 14B:
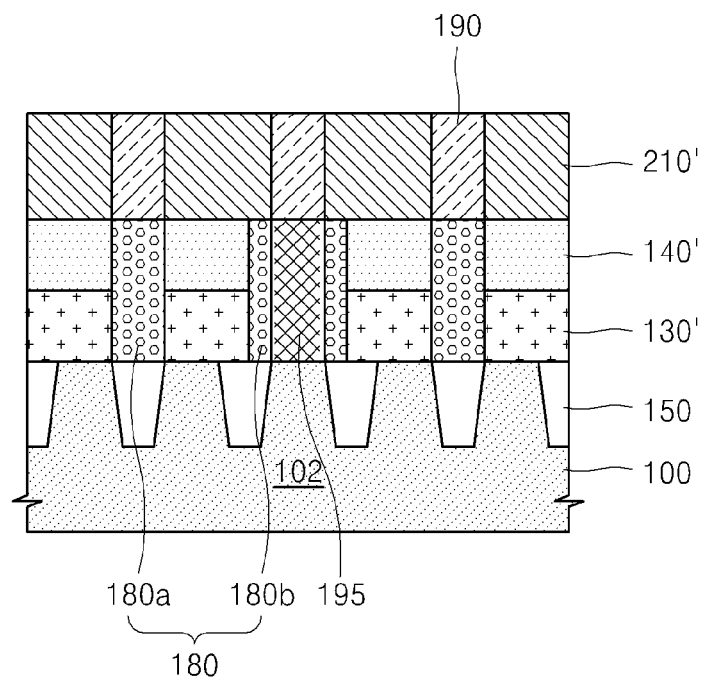
Figure 14C:
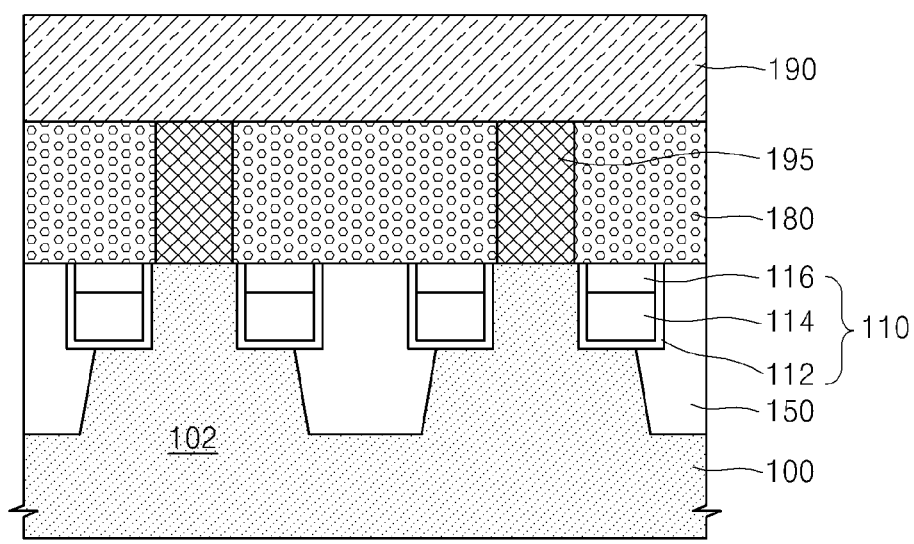
Figure 15:
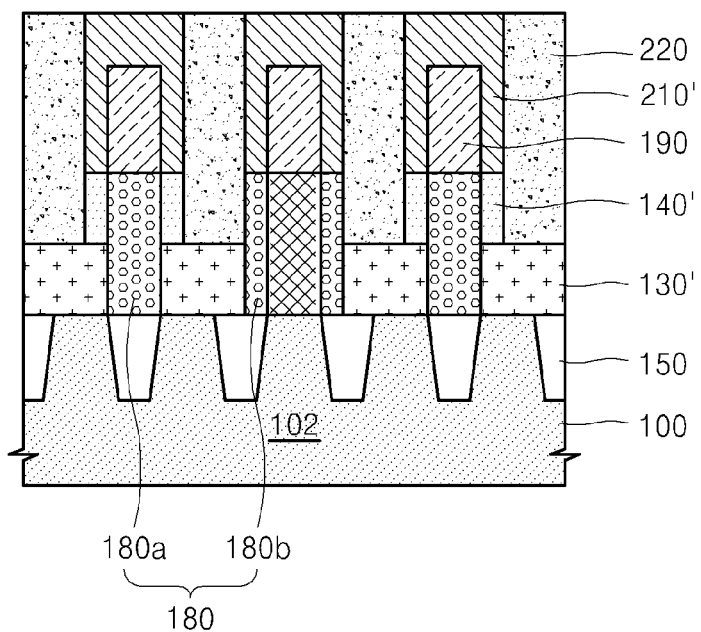
FIGS. 15 and 16 are cross-sectional views for describing a method of fabricating the semiconductor device corresponding to FIG. 14B after the process shown in FIGS. 14A to 14C.
Figure 16:
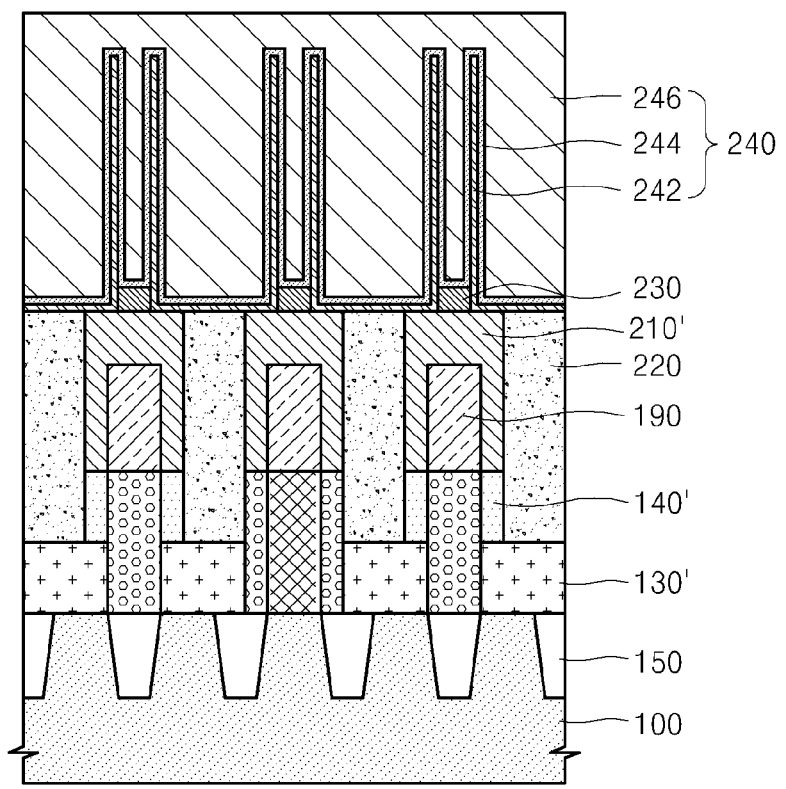

FIGS. 15 and 16 are cross-sectional views for describing a method of fabricating the semiconductor device corresponding to FIG. 14B after the process shown in FIGS. 14A to 14C.

Referring to FIG. 15, an upper second interlayer insulating layer is formed to cover the bit lines 190 to form a second interlayer insulating layer 210' after forming the bit lines 190. Then, buried contacts 220 that penetrate the second interlayer insulating layer 210' and contact the first conductive line layer 130', i.e., the landing pad LP 130', may be formed. The buried contacts 220 may be formed between the bit lines 190. In addition, since the landing pads 130' are connected to the active region 102 of the semiconductor substrate 100, the buried contacts 220 may be electrically connected to the active regions 102 via the landing pads 130'.

Referring to FIG. 16, a capacitor 240 may be formed on the buried contacts 220 after forming the buried contacts 220. The capacitor 240 may include a lower electrode 242 that contacts with the buried contacts 220, a dielectric layer 244 that is formed on the lower electrode 242, and an upper electrode 246 that is formed on the dielectric layer 244. Although the height of the capacitor 240 is relatively low in FIG. 16, the height of the capacitor 240 may have a very high aspect ratio. Here, 230 is an etch stopper.

Figure 17A:
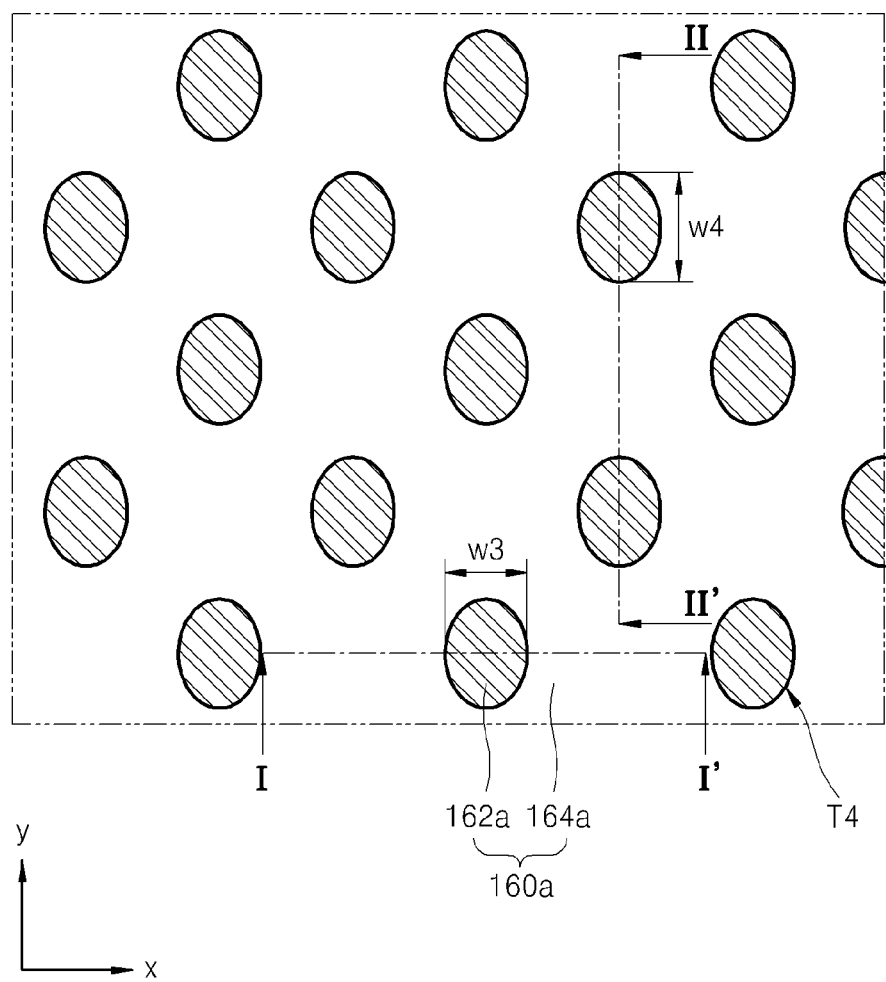
FIGS. 17A to 18C are plan views and cross-sectional views for describing a method of fabricating the semiconductor device of FIG. 1 according to example embodiments of the inventive concepts.

FIGS. 17A to 18C are plan views and cross-sectional views for describing a method of fabricating the semiconductor device 1000 of FIG. 1, according to example embodiments of the inventive concepts. FIGS. 17A to 17C may correspond to FIGS. 5A to 5C, and FIGS. 18A to 18C may correspond to FIGS. 6A to 6C.

Figure 17B:
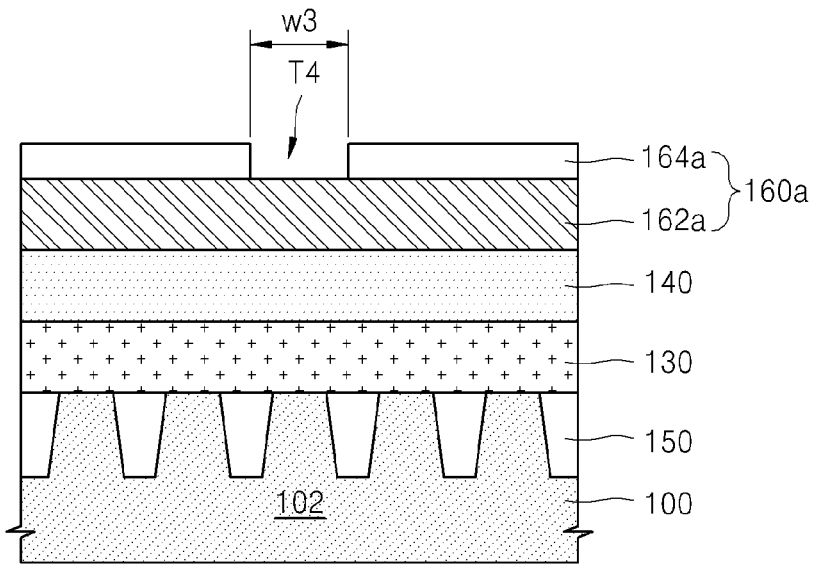
Figure 17C:
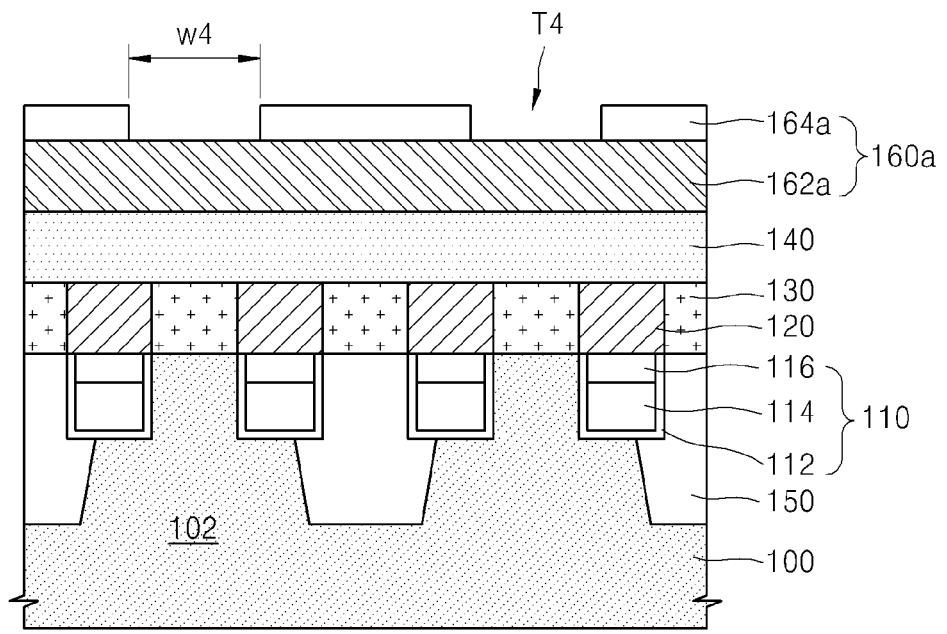

Referring to FIGS. 17A to 17C, a first mask layer 160a may be formed on the capping insulating layer 140. The first mask layer 160a may have a single-layer or multi-layer structure, a top layer of which has an open area. If the first mask layer 160a has a multi layer structure, the first mask layer 160a may have a structure in which at least two hard mask layers having different etching characteristics under a predetermined etching condition are stacked. The first mask layer 160a may be formed of a material easily removed by using ashing and stripping processes.

For example, the first mask layer 160a may have a double layer structure including a SOH layer 162a as a lower layer and a first SiON layer 164a as an upper layer. The SOH layer 162a, as the lower layer, may be replaced with the ACL.

In the first SiON layer 164a as the upper layer, an open area, i.e., an opening T4, may be formed in a portion in which a direct contact is to be formed later. Accordingly, an upper surface of the SOH layer 162a may be exposed by the opening T4 of the first SiON layer 164a. The first SiON layer 164a may also perform an anti-reflection function during a photolithography process and may have an organic anti-reflection layer (not shown) formed thereon. If the organic anti-reflection layer (not shown) is formed, the organic anti-reflection layer may also be patterned to form the opening T4.

The opening T4 may have a third width W3 in the x-axis direction and a fourth width W4 in the y-axis direction. The third width W3 may be less than the fourth width W4. However, the current embodiment is not limited thereto, and the third width W3 and the fourth width W4 may be the same or the fourth width W4 may be less than the third width W3. In addition, the x-axis direction third width W3 of the opening T4 may be greater than the width of fifth trenches T5 of the second SiON layer 174a that may be formed later. For example, the third width W3 of the opening T4 may be twice as large as the width of the fifth trenches T5 of the second SiON layer 174a.

Figure 18A:
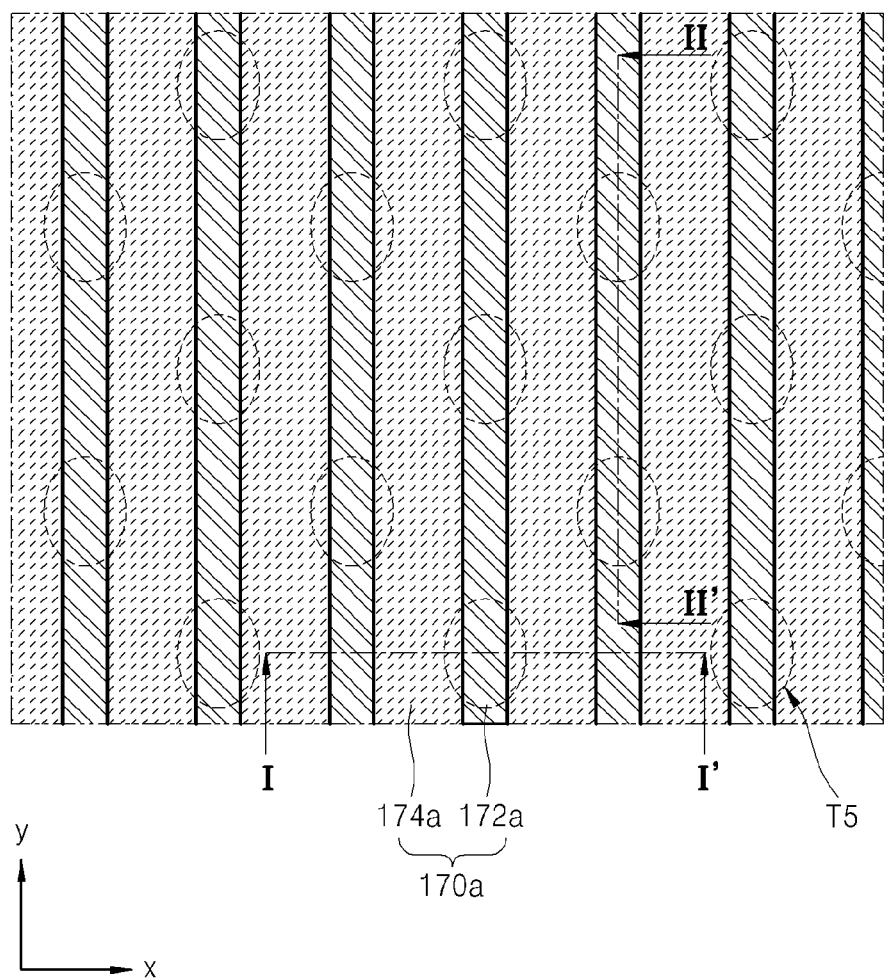
Figure 18B:
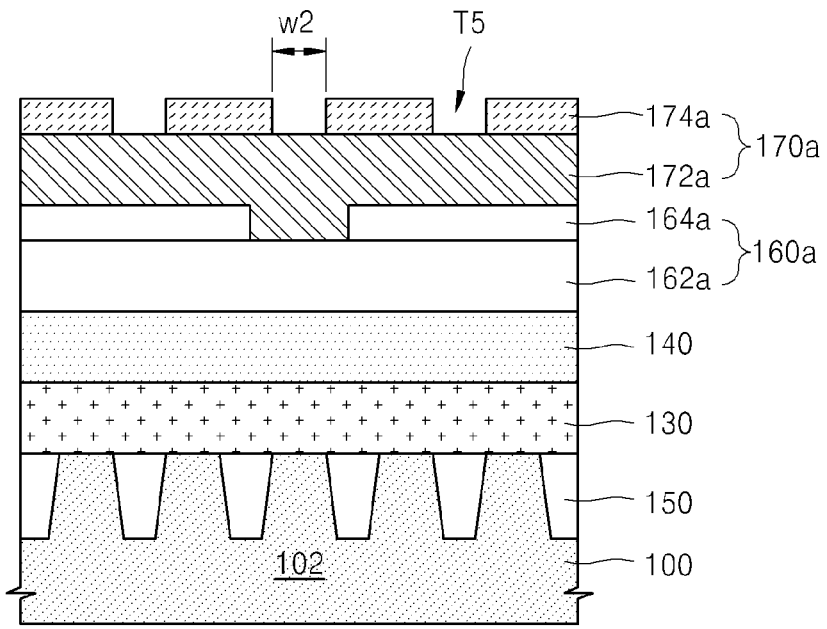
Figure 18C:
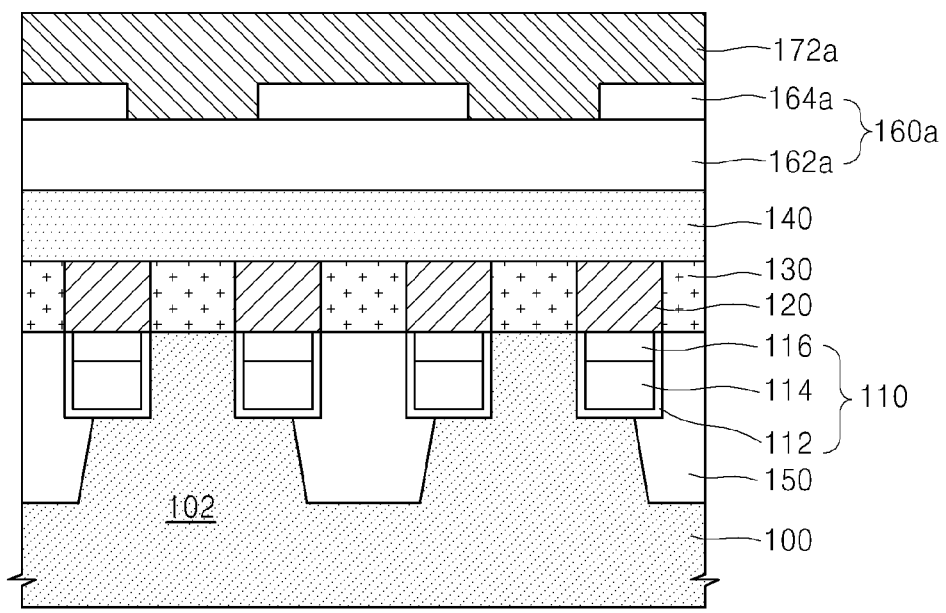

Referring to FIGS. 18A to 18C, a second mask layer 170a may be formed on the first mask layer 160a. The second mask layer 170a may also have a single-layer or a multi-layer structure, a top layer of which may have a linear pattern. If the second mask layer 170a has is a multi layer structure, the second mask layer 170a may have a structure in which at least two hard mask layers having different etching characteristics under a predetermined etching condition are stacked. The second mask layer 170a may be formed of a material easily removed by using ashing and stripping processes.

For example, the second mask layer 170a may have a double layer structure including an ACL 172a as a lower layer and the second SiON layer 174a as an upper layer. Also, the ACL 172a, as the lower layer, may also be replaced with the SOH layer.

The second SiON layer 174a, as the upper layer, may be patterned in a linear shape extending in the y-axis direction. Accordingly, the upper surface of the ACL 172a may be exposed by fifth trenches T5 of the second SiON layer 174a. The second SiON layer 174a may perform an anti-reflection function during a photolithography process. If desired, an organic anti-reflection layer (not shown) may further be formed on the second SiON layer 174a. In this case, the second SiON layer 174a and the organic anti-reflection layer may be patterned in a linear shape together.

The x-axis direction width of the second SiON layer 174a may be twice as large as a second width W2 of the width of the fifth trenches T5. However, the widths of the second SiON layer 174a and the fifth trenches T5 are not limited thereto. Also, portions in which the fifth trenches T5 are formed may correspond to portions in which bit lines are to be formed. A dashed line circle of FIG. 18A corresponds to an open area formed in the first SiON layer 164a.

As such, after the first mask layer 160a and the second mask layer 170a are formed, an etching process corresponding to FIGS. 7A to 11C is performed. Briefly, the ACL 172a is etched using the second SiON layer 174a as a mask, and the first SiON layer 164a is etched using the etched ACL 172a using an etch mask. In this regard, the second SiON layer 174a may be removed. By etching the first SiON layer 164a, linear trenches connecting the opening T4, e.g., trenches corresponding to fifth trenches T5, may be formed in the first SiON layer 164a.

Then, the SOH layer 162a is etched using the first SiON layer 164a as a mask. In this regard, the ACL 172a may be removed. Then, the capping insulating layer 140 is etched using the first mask layer 160a, including the first SiON layer 164a and the SOH layer 162a, as a mask. After the first mask layer 160a is removed, the first conductive line layer 130 and the first interlayer insulating layer 120 are etched using the capping insulating layer 140 as a mask.

After the etching process, patterns formed in the capping insulating layer 140, the first conductive line layer 130, and the first interlayer insulating layer 120 may be identical to the patterns formed in the capping insulating layer 140, the first conductive line layer 130, and the first interlayer insulating layer 120 shown in FIGS. 11A to 11C.

According to example embodiments, the first mask layer 160 and the second mask layer 170 may be formed in reverse order of FIGS. 5A to 6C and etched, and the results are the same.

Figure 19:
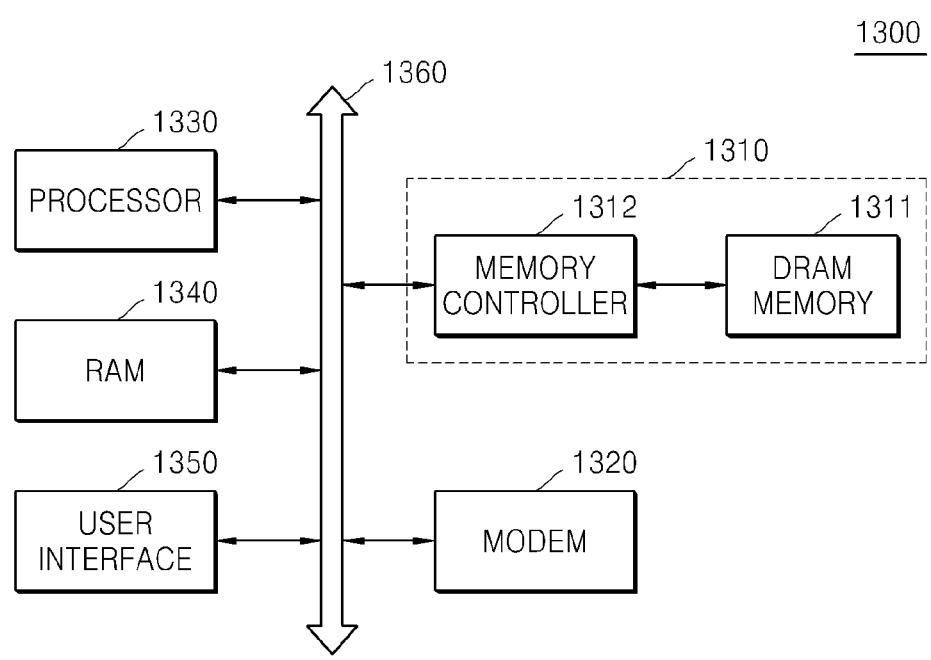
FIG. 19 is a block diagram of a memory system including a semiconductor device, according to example embodiments of the inventive concepts.

FIG. 19 is a block diagram of a memory system 1300 including a semiconductor device according to example embodiments of the inventive concepts.

Referring to FIG. 19, the memory system 1300 includes a processor 1330, for example, a CPU, which communicates via a common bus 1360, a random access memory (RAM) 1340, a user interface 1350, a modem 1320, and a memory module 1310. The memory module 1310 may include a DRAM memory 1311 and a memory controller 1312.

The processor 1330, the RAM 1340, the user interface 1350, and the modem 1320 transfer a signal to the memory module 1310 and receive a signal from the memory module 1310 via the bus 1360. Each of the components including the memory module 1310, the processor 1330, the RAM 1340, the user interface 1350, and the modem 1320 of the memory system 1300 may include pattern alignments formed according to processes of example embodiments of the inventive concepts.

The memory system 1300 may be applied to a variety of electronic devices such as solid state drives (SSD), CMOS image sensors (CIS), and computer application chip sets. Such memory systems and devices may be fabricated in at least one of the various packages including ball grid arrays (BGA), chip scale packages (CSP), plastic leaded chip carrier (PLCC), plastic dual in-line package (PDIP), multi-chip package (MCP), wafer-level fabricated package (WFP), and wafer-level processed stock package (WSP). However, the package is not limited thereto.

While the inventive concepts have been particularly shown and described with reference to example embodiments thereof, it will be understood that various changes in form and details may be made therein without departing from the spirit and scope of the following claims.

What is claimed is:

1. A method of fabricating a semiconductor device, the method comprising:
   forming a plurality of first conductive line layers on a semiconductor substrate, the plurality of first conductive line layers extending in a first direction and spaced apart from each other in a second direction perpendicular to the first direction, the semiconductor substrate having an active region extending in a third direction, the third direction being oblique with respect to the first direction;
   forming a first mask layer on the plurality of first conductive line layers, the first mask layer having line patterns extending in the second direction;
   forming a second mask layer on the first mask layer, the second mask layer having an open area for a first contact;
   forming a trench comprising a line area corresponding to the line patterns and a contact area corresponding to the open area in the second mask layer by etching the plurality of first conductive line layers using the first mask layer and the second mask layer;
   forming a gap filling layer filling the line area of the trench and forming spacers on sidewalls of the contact area of the trench; and
   forming a second conductive line layer on the gap filling layer, the second conductive line layer extending in the second direction and electrically connected to the active region.

2. The method of claim 1, further comprising:
   partitioning the plurality of first conductive line layers into a plurality of landing pads such that the plurality of landing pads are aligned in a zigzag pattern along the second direction.

3. The method of claim 2, wherein
   the plurality of landing pads are alternately disposed in a line in the first direction at a first interval and a second interval which are different from each other, and
   the active region crosses a portion of the second interval, and both ends of the active region are electrically connected to the plurality of landing pads.

4. The method of claim 1, further comprising:
   forming a first interlayer insulating layer on the active region and a device isolation layer defining the active region before the forming the plurality of first conductive line layers, wherein the forming the plurality of first conductive line layers includes
       forming a first trench in the first interlayer insulating layer by etching the first interlayer insulating layer, the first trench in the first interlayer insulating layer being formed to have a linear shape in the first direction and being formed to expose the device isolation layer and the active region, and
       filling the first trench with a conductive material to form the plurality of first conductive line layers; and
   forming a capping insulating layer on the first interlayer insulating layer and the plurality of first conductive line layers.

5. The method of claim 4, wherein
   the first mask layer comprises a lower first mask layer and an upper first mask layer and the line patterns are formed in the upper first mask layer, and
   the second mask layer comprises a lower second mask layer and an upper second mask layer, and the open area is formed in the upper second mask layer.

6. The method of claim 5, wherein
   a first direction width of the open area of the upper second mask layer is greater than an interval between the line patterns of the upper first mask layer, and
   the forming the trench comprising the line area and the contact area comprises
       etching the lower second mask layer using the upper second mask layer as an etch mask;
       etching the upper first mask layer using the lower second mask layer as an etch mask;
       etching the lower first mask layer using the upper first mask layer as an etch mask;
       etching the capping insulating layer using the upper first mask layer and the lower first mask layer as etch masks; and
       exposing the device isolation layer and the active region by etching the plurality of first conductive line layers and the first interlayer insulating layer using the capping insulating layer as an etch mask.

7. The method of claim 6, further comprising:
   forming the first contact electrically connected to the active region by filling a space between the spacers on the sidewalls of the contact area with a conductive material before the forming the second conductive line layer.

8. The method of claim 1, wherein the plurality of first conductive line layers comprise polysilicon,
   the first mask layer comprises a lower first mask layer and an upper first mask layer, wherein the lower first mask layer comprises an amorphous carbon layer (ACL), and the upper first mask layer comprise a silicon oxide nitride (SiON) layer, and the second mask layer comprises a lower second mask layer and an upper second mask layer, wherein the lower second mask layer comprises a spin-on hard mask (SOH) layer, and the upper second mask layer comprises a silicon oxide nitride (SiON) layer.

9. The method of claim 1, further comprising:
partitioning the plurality of first conductive line layers into a plurality of landing pads and providing the gap filling layer between the plurality of landing pads; and
filling a space between the spacers on the sidewalls of the contact area with polysilicon before the forming the second conductive line layer to form a direct contact (DC) electrically connecting the active region with the second conductive line, wherein the second conductive line is a bit line.

10. The method of claim 9, further comprising:
forming a second interlayer insulating layer on the bit line;
forming a buried contact (BC) penetrating the second interlayer insulating layer to be electrically connected to the plurality of landing pads; and
forming a capacitor structure electrically connected to the buried contact.

11. The method of claim 10, further comprising:
forming at least two buried gate lines in the semiconductor substrate before the forming the plurality of first conductive line layers, the at least two buried gate lines extending in the first direction, wherein
the active region has a bar shape,
the at least two buried gate lines cross the active region,
the direct contact is at a middle of the active region,
the landing pads are at both ends of the active region, and the buried contact is on one of the landing pads, and
the direct contact and the buried contact are aligned in lines along the first direction, and the landing pads are aligned in a zigzag line with respect to the second direction.

12. A method of fabricating a semiconductor device including a contact, the method comprising:
forming a first conductive line layer on a semiconductor substrate, the first conductive line layer comprising a plurality of first conductive lines each having a linear shape that extends in a first direction, each of the first conductive lines being spaced apart from each other in a second direction perpendicular to the first direction, the semiconductor substrate having an active region extending at an oblique angle with respect to the first direction;
forming a first mask layer on the first conductive line layer, the first mask layer comprising a lower first mask layer and an upper first mask layer, the upper first mask layer having an open area for forming a first contact;
forming a second mask layer on the first mask layer, the second mask layer comprising a lower second mask layer and an upper second mask layer, the upper second mask layer having a line pattern extending in the second direction;
forming a trench by etching the first conductive line layer using the first mask layer and the second mask layer, the trench including a line area corresponding to the line pattern and a contact area corresponding to the open area;
forming a gap filling layer filling the line area of the trench and forming spacers on sidewalls of the contact area of the trench;
forming a first contact by filling a space between the spacers on the sidewalls of the contact area with a conductive material; and
forming a second conductive line layer on the gap filling layer, the second conductive line layer being formed in a linear shape in the second direction and electrically connected to the active region via the first contact.

13. The method of claim 12, wherein
a capping insulating layer is formed on the first conductive line layer, and
the forming the trench includes
etching the lower second mask layer using the upper second mask layer as an etch mask;
etching the upper first mask layer using the lower second mask layer as an etch mask;
etching the lower first mask layer using the upper first mask layer as an etch mask;
etching the capping insulating layer using the upper first mask layer and the lower first mask layer as etch masks; and
exposing a device isolation and the active region by etching the first conductive line layer using the capping insulating layer as an etch mask, the device isolation layer being in the semiconductor substrate.

14. The method of claim 12, further comprising:
partitioning the first conductive line layer into a plurality of landing pads, wherein the plurality of landing pads are formed such that the plurality of landing pads are alternately aligned in a line at a first interval and a second interval which are different from each other with respect to the first direction and are arranged in a zigzag line with respect to the second direction and the forming the gap filling layer includes forming the gap filling layer between the plurality of landing pads.

15. The method of claim 14, further comprising:
forming at least two buried gate lines in the semiconductor substrate, the at least two buried gates lines extending in the first direction to cross the active region, wherein the first contact is formed at a middle of the active region, at least two of the landing pads are formed respectively at both ends of the active region, a second contact is formed on the landing pads, and the first contact and the second contact are aligned in lines along the first direction.

16. A method of fabricating a semiconductor device, the method comprising:
providing a substrate having an elongated active region thereon, the elongated active region extending in a first direction;
forming a plurality of first conductive line layers on the substrate, the plurality of first conductive line layers extending in a second direction and being spaced apart from each other in a third direction which is perpendicular to the second direction;
forming a direct contact at a middle of the elongated active region;
forming first and second landing pads at first and second ends of the elongated active region;
forming a bit line on the direct contact; and
forming first and second buried contacts on the first and second landing pads, wherein the first and second buried contacts are formed eccentrically on the first and second landing pads, and the first direction and the second direction form an oblique angle.

17. The method according to claim 16, wherein the forming the direct contact includes
forming a first mask layer on the substrate, the first mask layer having a line pattern extending in the third direction;
forming a second mask layer on the first mask layer, the second mask layer having an open area;

forming a trench comprising a line area and a contact area corresponding to the open using the first mask layer and the second mask layer, forming a spacer on sidewalls of the contact area, and filling the contact area with a conductive material.

18. The method according to claim 16, wherein the forming the first and second landing pads includes forming a first mask layer on the plurality of first conductive line layers, the first mask layer having a line pattern extending in the third direction, forming a second mask layer on the first mask layer, the second mask layer having an open area for the direct contact, forming a trench comprising a line area corresponding to the line pattern and a contact area corresponding to the open area by etching the plurality of first conductive line layers using the first mask layer and the second mask layer, and partitioning the plurality of first conductive line layers into the first and second landing pads using the first and second mask layers.

19. The method according to claim 18, wherein the first and second buried contacts sandwich the bit line.

20. The method according to claim 19, wherein the first and second buried contacts sandwich the direct contact.

* * * * *